(12) United States Patent
Jeon et al.

(10) Patent No.: US 12,237,349 B2
(45) Date of Patent: Feb. 25, 2025

(54) IMAGE SENSOR AND IMAGE SIGNAL PROCESSING METHOD

(71) Applicant: SAMSUNG ELECTRONICS CO., LTD., Suwon-si (KR)

(72) Inventors: Seung Wan Jeon, Hwaseong-si (KR); Kun Dong Kim, Seongnam-si (KR); Dong Young Song, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 591 days.

(21) Appl. No.: 17/667,782

(22) Filed: Feb. 9, 2022

(65) Prior Publication Data
US 2022/0384499 A1     Dec. 1, 2022

(30) Foreign Application Priority Data

May 28, 2021    (KR) ................. 10-2021-0068919
Jul. 30, 2021    (KR) ................. 10-2021-0100562

(51) Int. Cl.
     *H01L 27/146*      (2006.01)

(52) U.S. Cl.
     CPC .. *H01L 27/14607* (2013.01); *H01L 27/14636* (2013.01); *H01L 27/14645* (2013.01); *H01L 27/14627* (2013.01)

(58) Field of Classification Search
CPC ......... H01L 27/14607; H01L 27/14636; H01L 27/14645; H01L 27/14627; H04N 23/843; H04N 25/778; H04N 25/79; H04N 25/68
See application file for complete search history.

(56) References Cited

U.S. PATENT DOCUMENTS

| | | |
|---|---|---|
| 6,611,288 B1 | 8/2003 | Fossum et al. |
| 6,737,625 B2 | 5/2004 | Baharav et al. |
| 6,768,512 B1 | 7/2004 | Hsieh |
| 7,015,961 B2 | 3/2006 | Kakarala |
| | (Continued) | |

FOREIGN PATENT DOCUMENTS

JP      2015056710 A      3/2015

OTHER PUBLICATIONS

European Search Report issued Sep. 26, 2022 by the European Patent Office in corresponding patent application No. 22168246.1.
(Continued)

*Primary Examiner* — Tony Ko
(74) *Attorney, Agent, or Firm* — Sughrue Mion, PLLC

(57) ABSTRACT

An image sensor includes a pixel array including first to third pixel groups, including first to third color pixels having first to third colors and outputting first to third pixel signal for the first to third colors, and an image signal processor receiving the first to third pixel signals, wherein the image signal processor, when the first pixel signal is a bad pixel signal, performs bad pixel correction on the first pixel signal based on the second pixel signal and the third pixel signal and generates a remosaiced pixel signal for the first through third colors by remosaicing the second and third pixel signals based on each other, and the corrected pixel signal and the remosaiced pixel signal represent information in which the first through third color pixels are rearranged in a second pattern having a higher frequency than a frequency of a first pattern.

20 Claims, 28 Drawing Sheets

(56) References Cited

U.S. PATENT DOCUMENTS

| | | |
|---|---|---|
| 7,034,873 B2 | 4/2006 | Mendis et al. |
| 7,034,874 B1 | 4/2006 | Reinhart et al. |
| 7,283,164 B2 | 10/2007 | Kakarala et al. |
| 7,920,751 B2 | 4/2011 | Li et al. |
| 8,860,851 B2 | 10/2014 | Goma et al. |
| 8,913,163 B2 | 12/2014 | Seo |
| 8,971,659 B2 | 3/2015 | Forutanpour |
| 9,071,781 B2 | 6/2015 | Suzuki |
| 10,158,815 B2 | 12/2018 | Aflalo et al. |
| 10,791,289 B2 | 9/2020 | Maruyama et al. |
| 10,992,890 B2 | 4/2021 | Yamamoto |
| 11,843,871 B1 * | 12/2023 | Dey .................... G06T 9/00 |
| 2002/0005904 A1 | 1/2002 | Mendis |
| 2006/0239580 A1 | 10/2006 | Dierickx |
| 2010/0141810 A1 | 6/2010 | Wang et al. |
| 2012/0008017 A1 | 1/2012 | Jeong et al. |
| 2013/0051665 A1 | 2/2013 | Shinozaki |
| 2020/0336684 A1 | 10/2020 | Wang et al. |

OTHER PUBLICATIONS

Yeongheup Jang et al: "A new PDAF correction method of CMOS image sensor with Nonacell and Super PD to improve image quality in binning mode", Electronic Imaging, vol. 33, No. 9, Jan. 28, 2021 (Jan. 28, 2021), pp. 220-1-220-4, XP055960642, URL:http://dx.doi.org/10.2352/ISSN.2470-1173.2021.9.IQSP-220.

Communication issued on Jun. 17, 2024 by the European Patent Office for European Patent Application No. 22168246.1.

* cited by examiner

FIG. 15

IMAGE SENSOR AND IMAGE SIGNAL PROCESSING METHOD

This application is based on and claims priority under 35 U.S.C. § 119 to Korean Patent Application No. 10-2021-0068919, filed on May 28, 2021 and Korean Patent Application No. 10-2021-0100562, filed on Jul. 30, 2021, in the Korean Intellectual Property Office, the disclosures of which are incorporated by reference herein in their entireties.

BACKGROUND

1. Field

The disclosure relates to an image sensor and an image signal processing method.

2. Description of Related Art

An image sensing device is one of the semiconductor elements that convert optical information into an electrical signal. Image sensing devices may include charge coupled device (CCD) image sensing devices and complementary metal oxide semiconductor (CMOS) image sensing devices. A CMOS image sensor may be abbreviated as a CIS. A CIS may include a plurality of pixels arranged in two dimensions. Each of the pixels may include, for example, a photodiode. The photodiode may convert incident light into an electrical signal.

Recently, with the development of computer and communication industries, the demand for image sensors with enhanced performance has been increasing in various fields such as digital cameras, camcorders, smartphones, game devices, security cameras, micro-cameras for medical use, and robots.

SUMMARY

Aspects of the disclosure provide an image sensor with reduced error occurrence and improved image processing efficiency.

Aspects of the disclosure also provide an image signal processing method with reduced error occurrence and improved image processing efficiency.

However, aspects of the disclosure are not restricted to those set forth herein. The above and other aspects of the disclosure will become more apparent to one of ordinary skill in the art to which the disclosure pertains by referencing the detailed description of the disclosure given below.

In accordance with an aspect of the disclosure, an image sensor includes a pixel array including a first pixel group including a plurality of first color pixels having a first color and outputting a first pixel signal for the first color, a second pixel group including a plurality of second color pixels having a second color different from the first color and outputting a second pixel signal for the second color, and a third pixel group including a plurality of third color pixels having a third color different from the first and second colors and outputting a third pixel signal for the third color; and an image signal processor configured to receive the first pixel signal, the second pixel signal, and the third pixel signal from the pixel array, wherein the image signal processor, based on the first pixel signal being determined as a bad pixel signal, is configured to generate a corrected pixel signal for the first through third colors by performing bad pixel correction on the first pixel signal based on the second pixel signal and the third pixel signal and generate a remosaiced pixel signal for the first through third colors by remosaicing the third pixel signal based on the second pixel signal and remosaicing the second pixel signal based on the third pixel signal, wherein the plurality of first color pixels, the plurality of second color pixels and the plurality of third color pixels are arranged in a first pattern in the pixel array, and wherein the corrected pixel signal and the remosaiced pixel signal represent information in which the first through third color pixels are rearranged in a second pattern having a higher frequency than a frequency of the first pattern.

In accordance with an aspect of the disclosure, an image sensor includes a pixel array a first pixel group including a plurality of first color pixels having a first color and outputting a first pixel signal for the first color, a second pixel group including a plurality of second color pixels having a second color different from the first color and outputting a second pixel signal for the second color, and a third pixel group including a plurality of third color pixels having a third color different from the first and second colors and outputting a third pixel signal for the third color; and a processor including a bad pixel corrector which, based on the first pixel signal being a bad pixel signal, is configured to generate a first corrected pixel signal for the first through third colors by performing bad pixel correction on the first pixel signal based on the second pixel signal and the third pixel signal; and a remosaic module which is configured to generate a first remosaiced pixel signal for the first through third colors by remosaicing the third pixel signal based on the second pixel signal and remosaicing the second pixel signal based on the third pixel signal.

In accordance with an aspect of the disclosure, an image signal processing method includes receiving a first pixel signal including a plurality of first pixel values for a first color, a second pixel signal including a plurality of second pixel values for a second color different from the first color, a third pixel signal including a plurality of third pixel values for a third color different from the first and second colors, and a fourth pixel signal including a plurality of fourth pixel values for the first color; determining whether the plurality of first pixel values are bad pixel values; based on the plurality of first pixel values being determined to be bad pixel values, detecting an angle from the first through fourth pixel signals; calculating a first conversion formula between the plurality of second pixel values and the plurality of fourth pixel values based on the plurality of second pixel values, the plurality of fourth pixel values and the angle; calculating a second conversion formula between the plurality of third pixel values and the plurality of fourth pixel values based on the plurality of third pixel values, the plurality of fourth pixel values and the angle; and generating corrected pixel values for the first through third colors by correcting the plurality of first pixel values based on at least one of the plurality of second pixel values, the plurality of third pixel values, and the plurality of fourth pixel values by using the first and second conversion formulas.

In accordance with an aspect of the disclosure, an image sensor includes a pixel array; and an image signal processor configured to receive a first pixel signal from a first pixel group of the pixel array and a second pixel signal from a second pixel group of the pixel array adjacent to the first pixel group; determine whether the first pixel signal is a bad pixel signal; based on the first pixel signal being determined to be the bad pixel signal, replace the first pixel signal with a corrected first pixel signal based on the second pixel signal; and output a pixel signal including the second pixel signal and the corrected first pixel signal.

BRIEF DESCRIPTION OF THE DRAWINGS

The above and other aspects, features, and advantages of certain embodiments of the disclosure will be more apparent from the following description taken in conjunction with the accompanying drawings in which:

FIG. 15 is a diagram for explaining generation of an image signal according to an embodiment.

DETAILED DESCRIPTION

Hereinafter, embodiments according to the technical spirit of the disclosure will be described with reference to the accompanying drawings.

For the sake of brevity, conventional elements to semiconductor devices may or may not be described in detail herein for brevity purposes.

Figure 1:
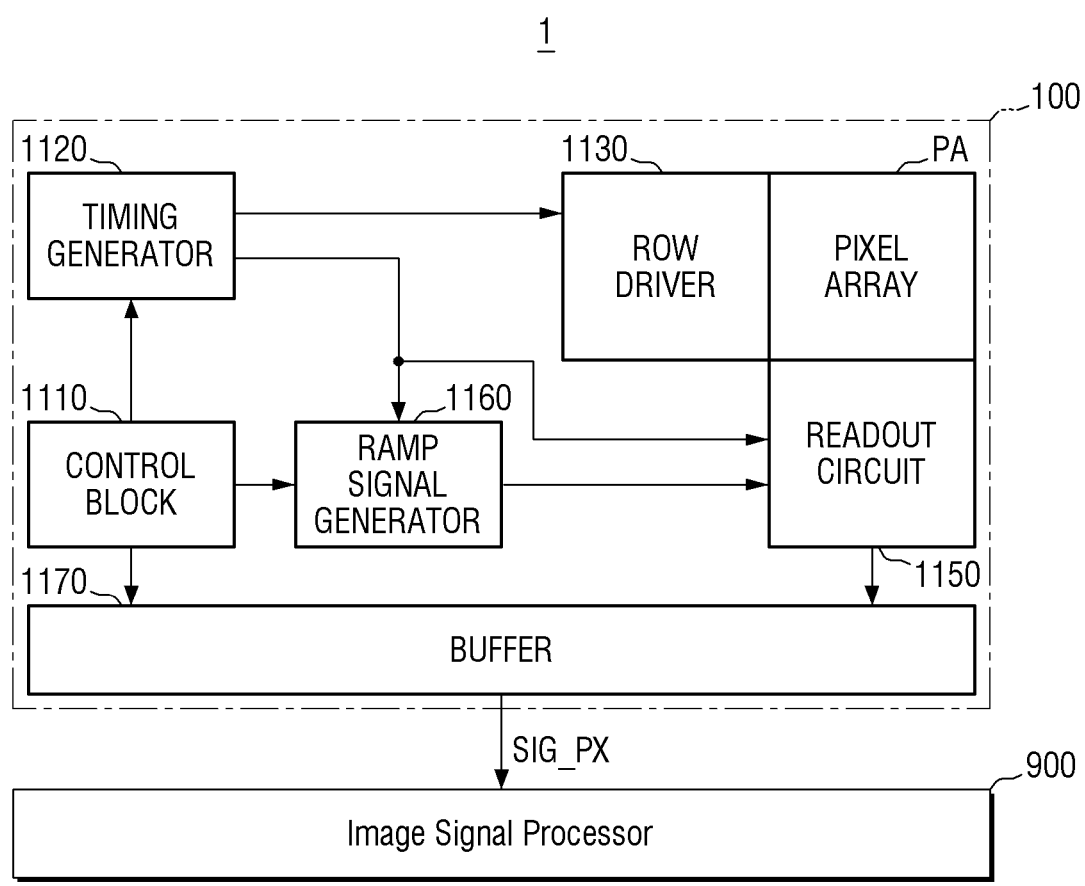
FIG. 1 is a block diagram of an image sensing device 1 according to an embodiment.

FIG. 1 is a block diagram of an image sensing device 1 according to embodiments.

Referring to FIG. 1, the image sensing device 1 may include an image sensor 100 and an image signal processor 900.

The image sensor 100 may generate a pixel signal SIG_PX by sensing an image of a sensing target using light. In some embodiments, the generated pixel signal SIG_PX may be, for example, a digital signal. However, embodiments are not limited thereto.

The pixel signal SIG_PX may be provided to and processed by the image signal processor 900. The image signal processor 900 may receive the pixel signal SIG_PX output from a buffer 1170 of the image sensor 100 and may process the received pixel signal SIG_PX to make it easy to be displayed.

In some embodiments, the image signal processor 900 may perform digital binning on the pixel signal SIG_PX output from the image sensor 100. Here, the pixel signal SIG_PX output from the image sensor 100 may be a raw image signal from a pixel array PA on which analog binning has not been performed, or the pixel signal SIG_PX may be a signal on which analog binning has already been performed.

In some embodiments, the image sensor 100 and the image signal processor 900 may be disposed separately from each other as illustrated in the drawing. For example, the image sensor 100 may be mounted on a first chip, the image signal processor 900 may be mounted on a second chip, and the image sensor 100 and the image signal processor 900 may communicate with each other through a predetermined interface. However, embodiments are not limited thereto, and the image sensor 100 and the image signal processor 900 may also be implemented as one package, for example, a multi-chip package (MCP).

The image sensor 100 may include a control register block 1110, a timing generator 1120, a row driver 1130, the pixel array PA, a readout circuit 1150, a ramp signal generator 1160, and the buffer 1170.

The control register block 1110 may control the overall operation of the image sensor 100. In particular, the control register block 1110 may directly transmit an operation signal to the timing generator 1120, the ramp signal generator 1160, and the buffer 1170.

The timing generator 1120 may generate a signal used as a reference for the operation timing of various elements of the image sensor 100. The operation timing reference signal generated by the timing generator 1120 may be transmitted to the row driver 1130, the readout circuit 1150, the ramp signal generator 1160, etc.

The ramp signal generator 1160 may generate and transmit a ramp signal used in the readout circuit 1150. For example, the readout circuit 1150 may include a correlated double sampler (CDS), a comparator, etc., and the ramp signal generator 1160 may generate and transmit a ramp signal used in the CDS, the comparator, etc.

The buffer 1170 may include, for example, a latch. The buffer 1170 may temporarily store the pixel signal SIG_PX to be provided to the outside and may transmit the pixel signal SIG_PX to an external memory or an external device. The buffer 1170 may include a memory such as a dynamic random access memory (DRAM) or a static random access memory (SRAM).

The pixel array PA may sense an external image. The pixel array PA may include a plurality of pixels (or unit pixels). The row driver 1130 may selectively activate rows of the pixel array PA.

The readout circuit 1150 may sample a pixel signal received from the pixel array PA, compare the pixel signal with the ramp signal received from the ramp signal generator 1160, and convert an analog image signal (data) into a digital image signal (data) based on the comparison result.

Figure 2:
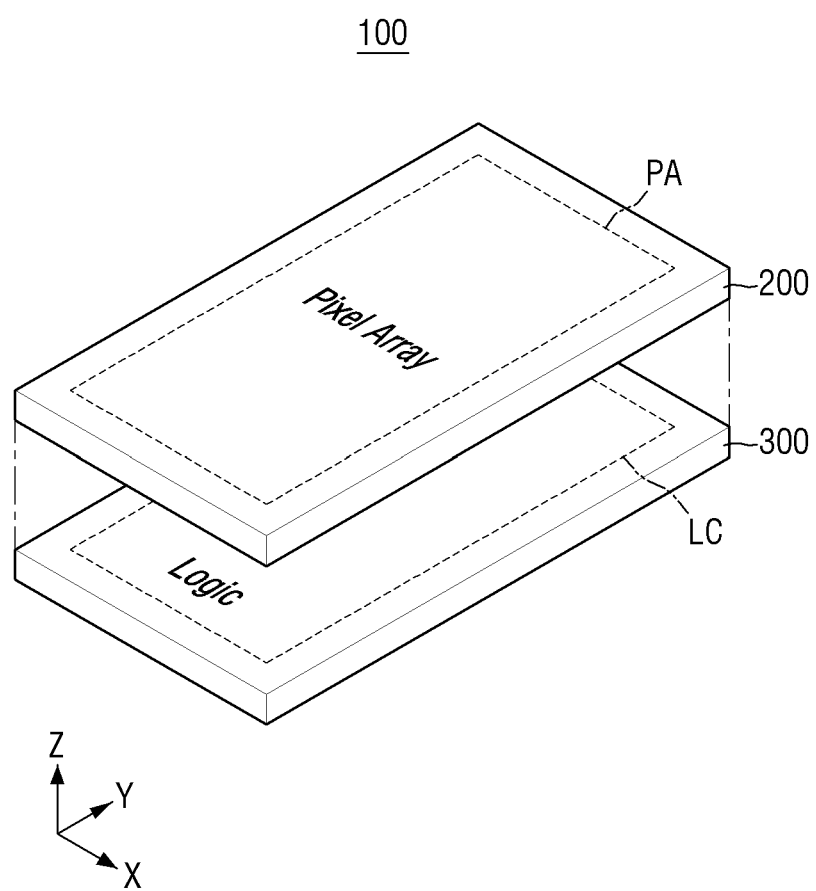
FIG. 2 illustrates the conceptual layout of an image sensor 100 according to an embodiment.

FIG. 2 illustrates the conceptual layout of an image sensor 100 according to embodiments.

Referring to FIG. 2, the image sensor 100 according to embodiments may include an upper chip 200 and a lower chip 300 that are stacked. A plurality of pixels may be disposed on the upper chip 200 in a two-dimensional array structure. That is, the upper chip 200 may include a pixel array PA. The lower chip 300 may include a logic region LC and a memory region. The lower chip 300 may be disposed under the upper chip 200 and may be electrically connected to the upper chip 200. The lower chip 300 may allow a pixel signal received from the upper chip 200 to be transmitted to the logic region LC of the lower chip 300.

Logic elements may be disposed in the logic region LC of the lower chip 300. The logic elements may include circuits for processing pixel signals from pixels. For example, the logic elements may include the control register block 1110, the timing generator 1120, the row driver 1130, the readout circuit 1150, and the ramp signal generator 1160 of FIG. 1.

Figure 3:
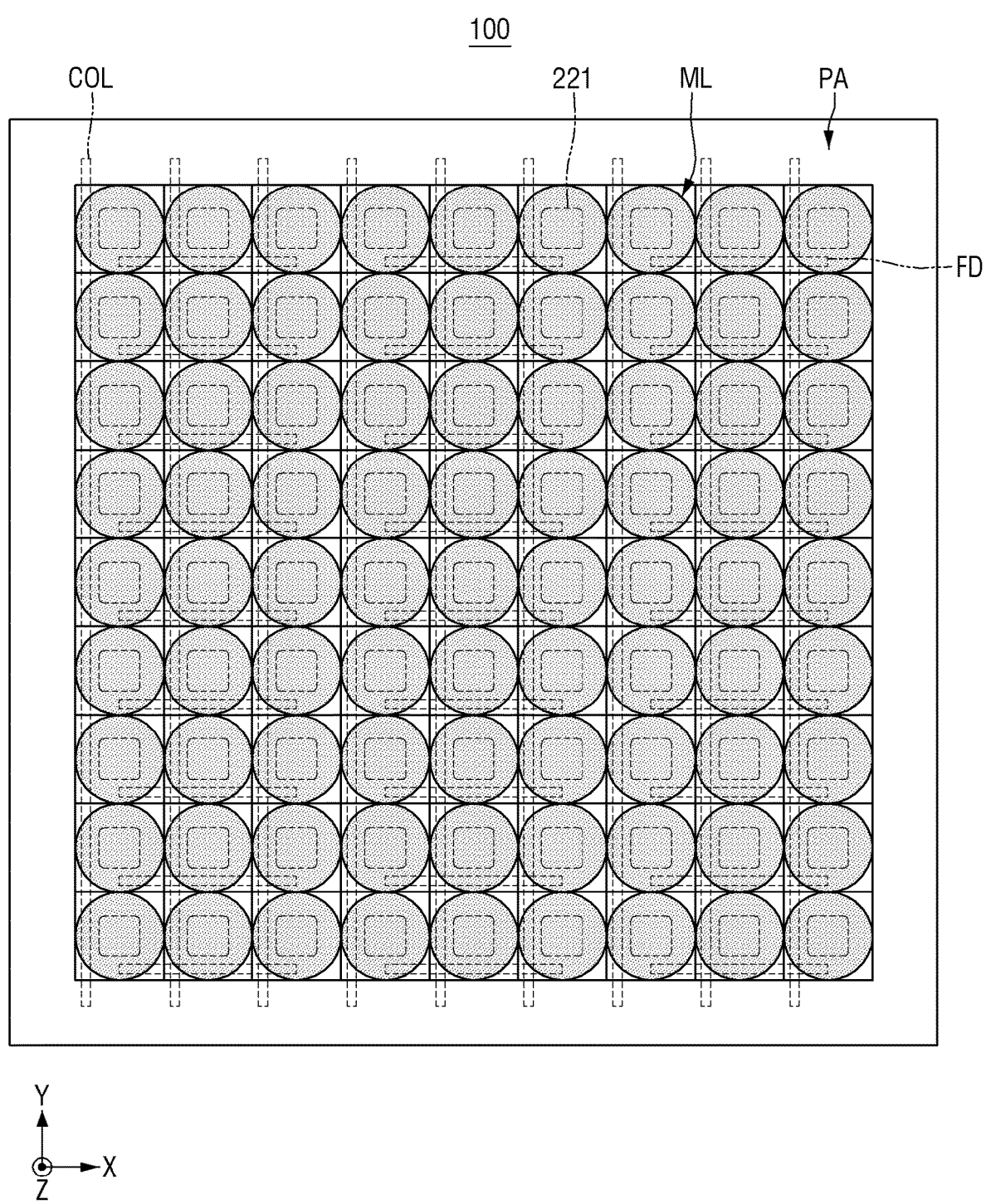
FIG. 3 is a top view of the image sensor 100 according to an embodiment.
Figure 4:
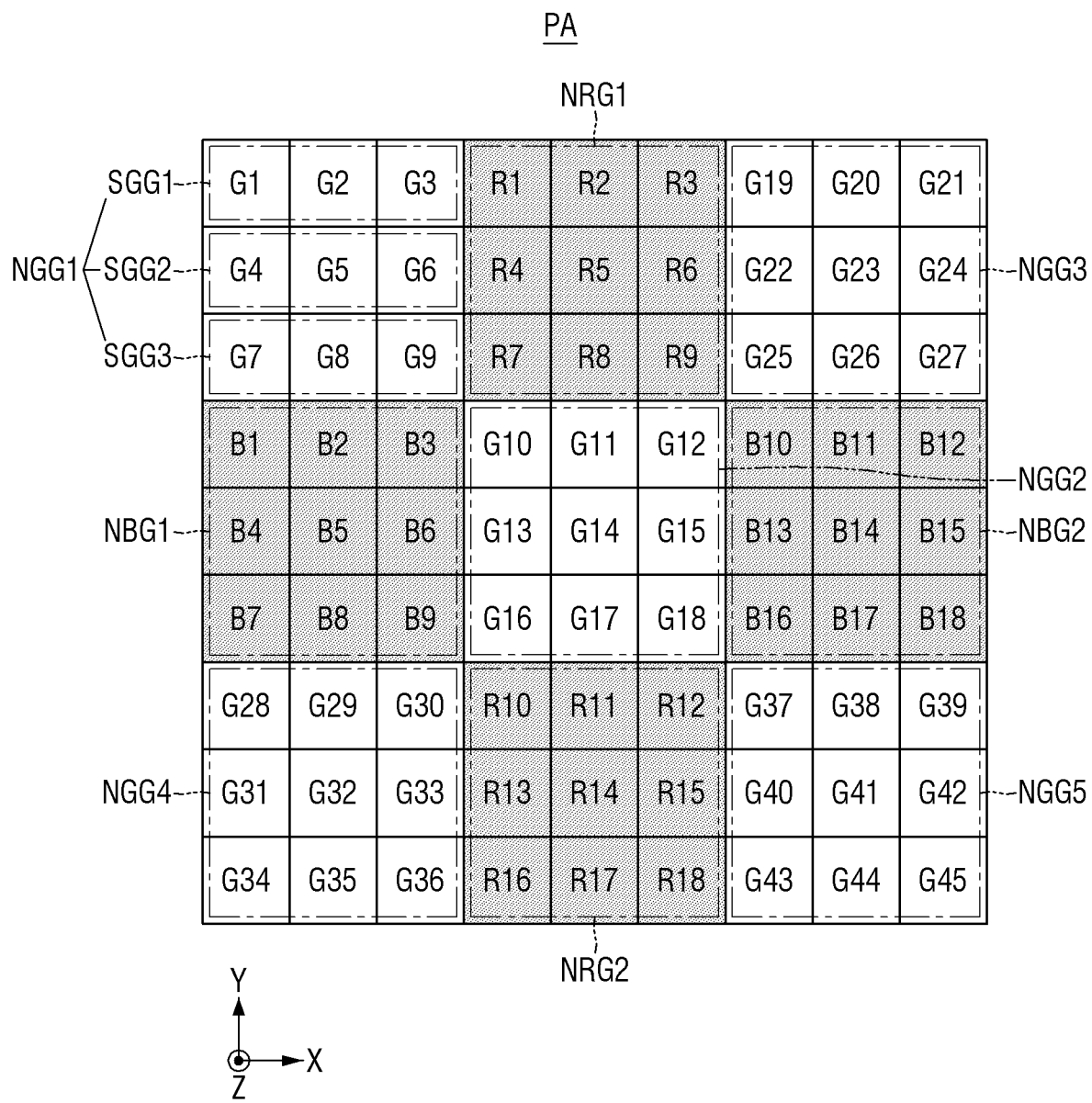
FIG. 4 illustrates the pixel array PA of FIG. 3.

FIG. 3 is a top view of the image sensor 100 according to the embodiments. FIG. 4 illustrates the pixel array PA of FIG. 3.

Referring to FIG. 3, the pixel array PA may be disposed on an upper surface of the image sensor 100. In detail, the pixel array PA may be disposed on an upper surface of the upper chip 200 of the image sensor 100. The pixel array PA may include a plurality of microlenses ML, a plurality of floating diffusions FD, a plurality of photoelectric conversion layers 221, and a plurality of column lines COL. Here, the microlenses ML and the photoelectric conversion layers 221 may be formed in each of the pixels of the pixel array PA, respectively.

Referring to FIG. 4, the pixel array PA may include first through fifth nona green pixel groups NGG1 through NGG5, first and second nona red pixel groups NRG1 and NRG2, and first and second nona blue pixel groups NBG1 and NBG2. FIG. 4 illustrates only a part of the pixel array PA, and the pixel array PA may include more pixels. Here, the first nona green pixel group NGG1 may include first through ninth green pixels G1 through G9, the second f green pixel group NGG2 may include tenth through eighteenth green pixels G10 through G18, the third nona green pixel group NGG3 may include nineteenth through twenty-seventh green pixels G19 through G27, the fourth nona green pixel group NGG4 may include twenty-eighth through thirty-sixth green pixels G28 through G36, and the fifth nona green pixel group NGG5 may include thirty-seventh through forty-fifth green pixels G37 through G45. For example, the tenth green pixel G10 may correspond to a subpixel located in an edge part of the second nona green pixel group NGG2 and the fourteenth green pixel G14 may correspond to a subpixel located in a central part of the second nona green pixel group NGG2. In addition, the first nona red pixel group NRG1 may include first through ninth red pixels R1 through R9, and the second nona red pixel group NRG2 may include tenth through eighteenth red pixels R10 through R18. In addition, the first nona blue pixel group NBG1 may include first through ninth blue pixels B1 through B9, and the second nona blue pixel group NBG2 may include tenth through eighteenth blue pixels B10 through B18.

As shown in FIG. 4, the first and second nona red pixel groups NRG1 and NRG2 and the first and second nona blue pixel groups NBG1 and NBG2 may be disposed between the first through fifth nona green pixel groups NGG1 through NGG5 in first and second directions X and Y. For example, the first nona red pixel group NRG1 may be disposed between the first nona green pixel group NGG1 and the third nona green pixel group NGG3 in the first direction X.

In addition, each of the first and second nona red pixel groups NRG1 and NRG2 and each of the first and second nona blue pixel groups NBG1 and NBG2 may contact some of the first through fifth nona green pixel groups NGG1 through NGG5. For example, the first nona red pixel group NRG1 may contact the first nona green pixel group NGG1, the second nona green pixel group NGG2, and the third nona green pixel group NGG3. That is, the pixel array PA may be arranged in an RGB nona pattern. The pixel array PA may include the first through fifth nona green pixel groups NGG1 through NGG5, the first and second nona red pixel groups NRG1 and NRG2, and the first and second nona blue pixel groups NBG1 and NBG2 disposed in a first pattern. Here, the first pattern may correspond to the RGB nona pattern. For example, the RGB nona pattern may correspond to a lower frequency pattern than an RGB Bayer pattern to be described later.

Each pixel group may include a color filter having a color. For example, the first through fifth nona green pixel groups NGG1 through NGG5 may include a color filter having a green color, the first and second nona red pixel groups NRG1 and NRG2 may include a color filter having a red color, and the first and second nona blue pixel groups NBG1 and NBG2 may include a color filter having a blue color. A color filter may be disposed on each pixel group, and light passing through the color filter may be converted into a pixel signal SIG_PX through the pixel group.

The first nona green pixel group NGG1 may include a first shared green pixel group SGG1, a second shared green pixel group SGG2, and a third shared green pixel group SGG3. The first shared green pixel group SGG1 may include the first green pixel G1, the second green pixel G2, and the third green pixel G3 arranged along the first direction X. The second shared green pixel group SGG2 may include the fourth green pixel G4, the fifth green pixel G5, and the sixth green pixel G6 arranged along the first direction X. The third shared green pixel group SGG3 may include the seventh green pixel G7, the eighth green pixel G8, and the ninth green pixel G9 arranged along the first direction X. The first shared green pixel group SGG1, the second shared green pixel group SGG2, and the third shared green pixel group SGG3 may be arranged along a second direction Y. Here, the second direction Y may be a direction intersecting the first direction X.

Here, each of the first shared green pixel group SGG1, the second shared green pixel group SGG2, and the third shared green pixel group SGG3 may correspond to a different respective floating diffusion FD. However, embodiments are not limited thereto, and all of the first shared green pixel group SGG1, the second shared green pixel group SGG2, and the third shared green pixel group SGG3 may also share a single floating diffusion FD. That is, the first nona green pixel group NGG1 may share one floating diffusion FD. In addition, each of the second through fifth nona green pixel groups NGG2 through NGG5, the first and second nona red pixel groups NRG1 and NRG2, and the first and second nona blue pixel groups NBG1 and NBG2 may share one respective floating diffusion FD. The pixel signal SIG_PX generated from each pixel group may be transmitted along the shared floating diffusion FD.

However, embodiments are not limited to Nonacell and may also be applied to a pixel array in which a pixel group including a plurality of pixels having the same color filter is arranged. For example, embodiments may be applied to Tetracell in which a unit pixel group is composed of four pixels having the same color filter. Here, the unit pixel group may mean a set of pixels including the same color filter among adjacent pixels.

In addition, embodiments are not limited to the illustration in FIG. 3, and one microlens ML may also be disposed to correspond to an entire unit pixel group.

Figure 5:
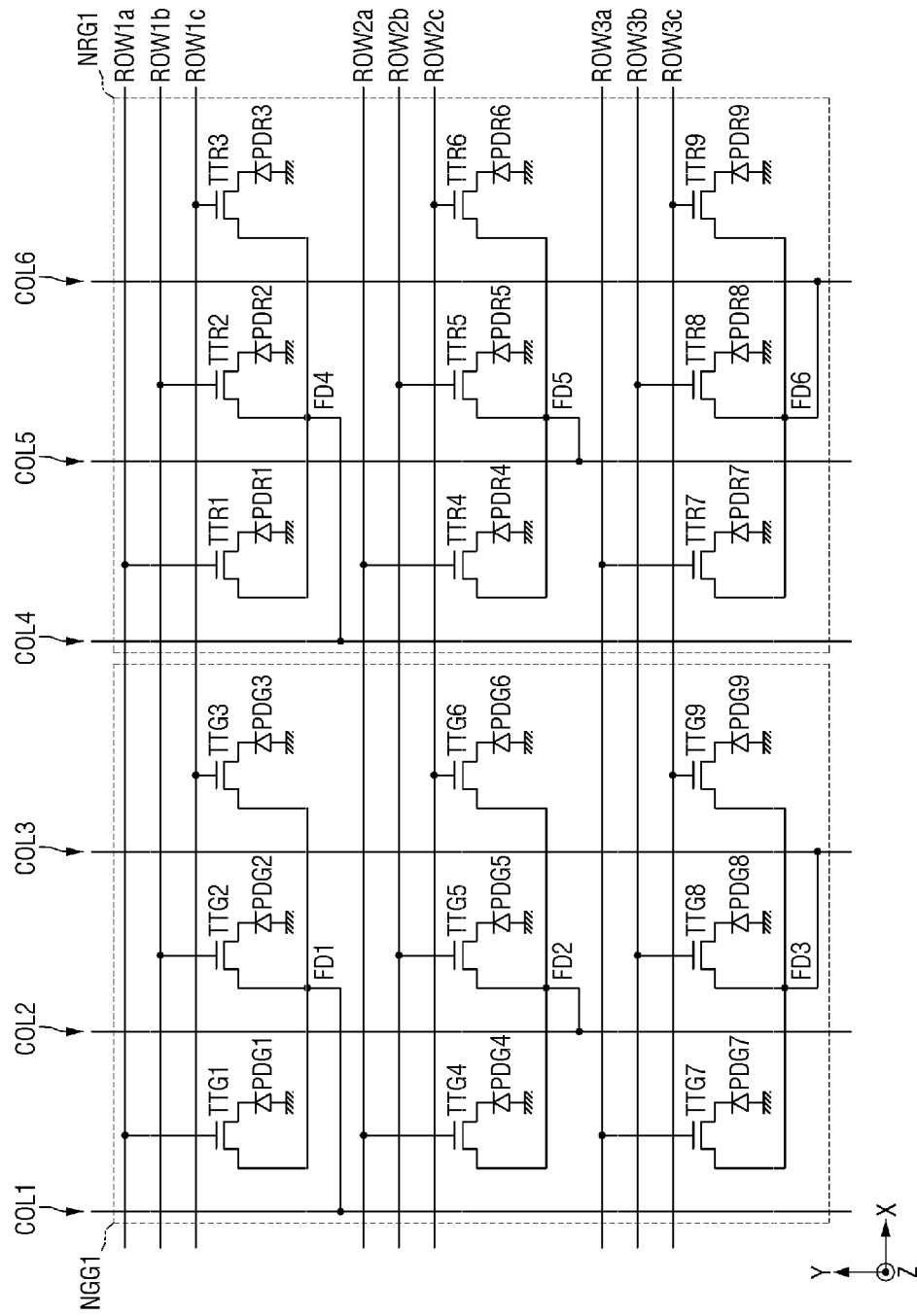
FIG. 5 is a circuit diagram of a pixel array PA according to an embodiment.
Figure 6:
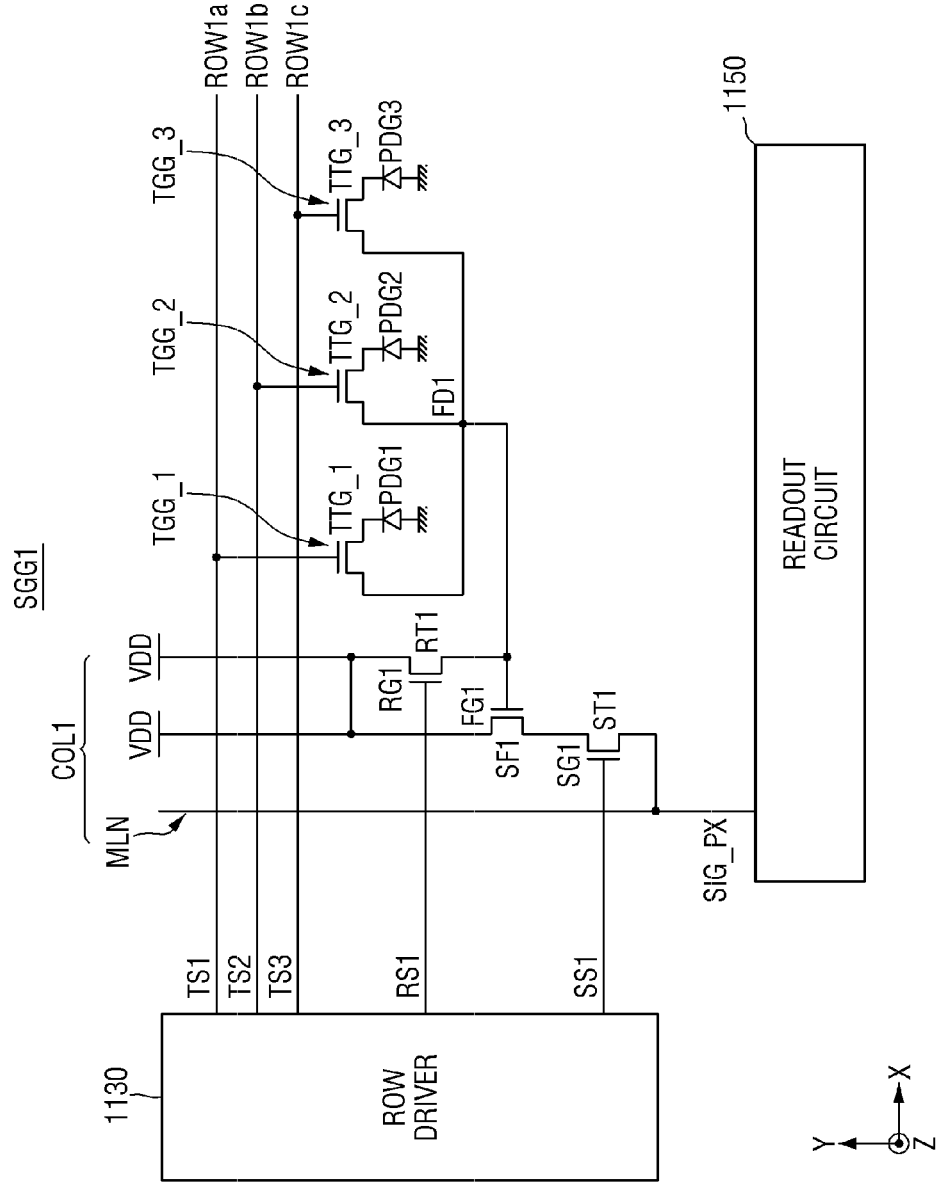
FIG. 6 is a circuit diagram of the pixel array PA according to an embodiment.
Figure 7:
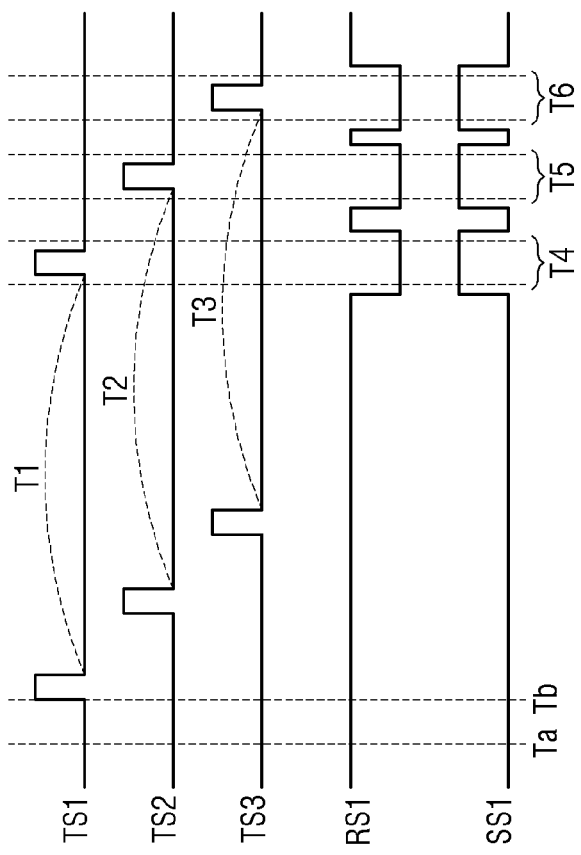
FIG. 7 is a timing diagram for explaining the operation of the image sensor 100 according to an embodiment.

FIG. 5 is a circuit diagram of a pixel array PA according to embodiments. FIG. 6 is a circuit diagram of the pixel array PA according to embodiments. FIG. 7 is a timing diagram for explaining the operation of the image sensor 100 according to embodiments.

Referring to FIG. 5, the pixel array PA may include a plurality of column lines COL1 through COL6, a plurality of row lines ROW1a through ROW1c, ROW2a through ROW2c and ROW3a through ROW3c, the first nona green pixel group NGG1, and the first nona red pixel group NRG1. That is, FIG. 5 illustrates the two nona pixel groups NGG1 and NRG1 among the pixel groups of FIGS. 3 and 4.

The column lines COL1 through COL6 and the row lines ROW1a through ROW1c, ROW2a through ROW2c and ROW3a through ROW3c may be formed across the first nona green pixel group NGG1 and the first nona red pixel group NRG1. The column lines COL1 through COL6 may extend in the second direction Y, and the row lines ROW1a through ROW1c, ROW2a through ROW2c and ROW3a through ROW3c may extend in the first direction X.

A transfer transistor of each pixel may be formed between the row lines ROW1a through ROW1c, ROW2a through ROW2c and ROW3a through ROW3c and the column lines COL1 through COL6. That is, the transfer transistor of each pixel may connect the row lines ROW1a through ROW1c, ROW2a through ROW2c and ROW3a through ROW3c and the column lines COL1 through COL6.

For example, gates of green pixel transfer transistors TTG1 through TTG9 may be connected to the row lines ROW1a through ROW1c, ROW2a through ROW2c and ROW3a through ROW3c, respectively. Sources/drains of the green pixel transfer transistors TTG1 through TTG9 may be connected to green pixel photodiodes PDG1 through PDG9, respectively.

The sources/drains of the green pixel transfer transistors TTG1 through TTG3 may be connected to a first floating diffusion FD1, and the first floating diffusion FD1 may be connected to the first column line COL1. The sources/drains of the green pixel transfer transistors TTG4 through TTG6 may be connected to a second floating diffusion FD2, and the second floating diffusion FD2 may be connected to the second column line COL2. The sources/drains of the green pixel transfer transistors TTG7 through TTG9 may be connected to a third floating diffusion FD3, and the third floating diffusion FD3 may be connected to the third column line COL3. However, embodiments are not limited thereto, and all of the sources/drains of the green pixel transfer transistors TTG1 through TTG9 may be connected to a single floating diffusion FD.

For example, gates of red pixel transfer transistors TTR1 through TTR9 may be connected to the row lines ROW1a through ROW1c, ROW2a through ROW2c and ROW3a through ROW3c, respectively. Sources/drains of the red pixel transfer transistors TTR1 through TTR9 may be connected to red pixel photodiodes PDR1 through PDR9, respectively.

The sources/drains of the red pixel transfer transistors TTR1 through TTR3 may be connected to a fourth floating diffusion FD4, and the fourth floating diffusion FD4 may be connected to the fourth column line COL4. The sources/drains of the red pixel transfer transistors TTR4 through TTR6 may be connected to a fifth floating diffusion FD5, and the fifth floating diffusion FD5 may be connected to the fifth column line COL5. The sources/drains of the red pixel transfer transistors TTR7 through TTR9 may be connected to a sixth floating diffusion FD6, and the sixth floating diffusion FD6 may be connected to the sixth column line COL6. However, embodiments are not limited thereto, and all of the sources/drains of the red pixel transfer transistors TTR1 through TTR9 may be connected to a single floating diffusion FD.

Referring to FIG. 6, the first shared green pixel group SGG1 may be connected to the first column line COL1. Here, the first column line COL1 may include a first reset transistor RT1, a first source follower transistor SF1, a first select transistor ST1, and a metal line MLN. First row lines ROW1a through ROW1c, a first reset gate RG1 of the first reset transistor RT1, and a first select gate SG1 of the first select transistor ST1 may be connected to the row driver 1130. The row driver 1130 may transmit first through third transfer control signals TS1 through TS3 to the first row lines ROW1a through ROW1c, transmit a reset control signal RS1 to the first reset gate RG1, and transmit a select control signal SS1 to the first select gate SG1. The row driver 1130 may cause the first shared green pixel group SGG1 to output a pixel signal SIG_PX by transmitting the signals.

The first floating diffusion FD1 may be connected to a source/drain of the first reset transistor RT1, and the other source/drain of the reset transistor RT1 may be connected to a power supply voltage VDD. In addition, the first floating diffusion FD1 may be connected to a source follower gate FG1 of the first source follower transistor SF1. A source/drain of the first source follower transistor SF1 may be connected to the power supply voltage VDD. The other source/drain of the first source follower transistor SF1 may be connected to a source/drain of the first select transistor ST1, and the other source/drain of the first select transistor ST1 may be connected to the metal line MLN.

Referring to FIG. 7, the first through third green pixels G1 through G3 of the first shared green pixel group SGG1 may output the pixel signal SIG_PX at different times T4 through T6 based on photocharges charged during their respective exposure times T1 through T3. At a time Ta, the row driver 1130 may transmit the reset control signal RS1 at a logic high to the first reset transistor RT1 so as to reset the first floating diffusion FD1. In this case, the first reset transistor RT1 may be turned on so that the power supply voltage VDD is applied to the first floating diffusion FD1.

At a time Tb, the row driver 1130 may transmit the first transfer control signal TS1 at a logic high to a gate electrode TGG_1 of a first green pixel transfer transistor TTG1. Accordingly, a first green pixel photodiode PDG1 may discharge all the charged photocharges to the first floating diffusion FD1. As a result, the first green pixel photodiode PDG1 may be reset at the time Tb.

During the exposure time T1, the first green pixel photodiode PDG1 may be charged with photocharges. That is, the first green pixel G1 may be exposed for the exposure time T1. In addition, a second green pixel photodiode PDG2 may be charged with photocharges during the exposure time T2, and a third green pixel photodiode PDG3 may be charged with photocharges during the exposure time T3.

Photocharges output from the first through third green pixel photodiodes PDG1 through PDG3 may be transferred to the first floating diffusion FD1 at different times T4 through T6. That is, the pixel signal SIG_PX may be output from each pixel at a different time. That is, the pixel signal SIG_PX may be transmitted to the readout circuit 1150 through the first column line COL1 by the reset control signal RS1 and the select control signal SS1 at different times T4, T5 or T6 for first through third green pixel photodiodes PDG1 through PDG3, respectively. Here, the pixel signal SIG_PX may be a pixel signal based on charges accumulated in at least one of the first through third green pixel photodiodes PDG1 through PDG3. In addition, the pixel signal SIG_PX may be output from the first source follower transistor SF1. The metal line MLN may receive the pixel signal SIG_PX from the first source follower transistor SF1 and transmit it to the readout circuit 1150.

A method of correcting bad pixels of the image sensing device 1 will now be described with reference to FIGS. 8 through 11.

Figure 8:
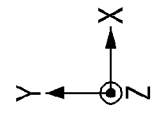
FIG. 8 illustrates a pixel array PA' according to an embodiment.
Figure 9:
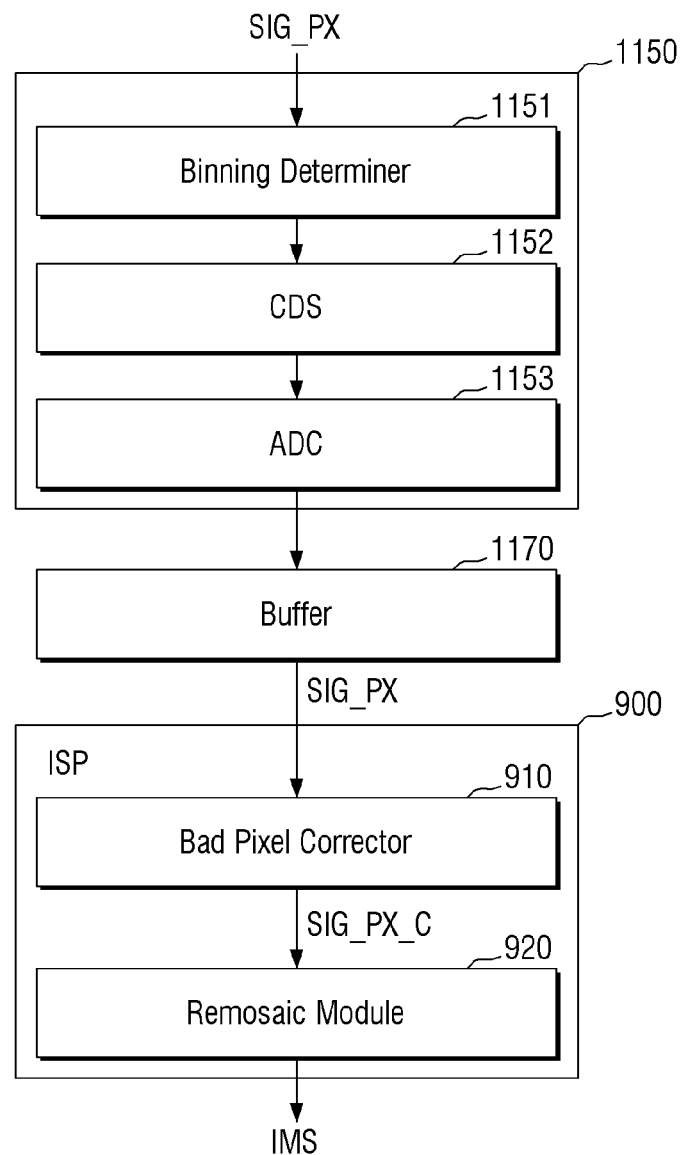
FIG. 9 is a block diagram of an image signal processor 900 according to an embodiment.

FIG. 8 illustrates a pixel array PA' according to embodiments. FIG. 9 is a block diagram of an image signal processor 900 according to embodiments.

Referring to FIG. 8, the pixel array PA' may include a first nona green pixel group NGG1', a second nona green pixel group NGG2', a first nona red pixel group NRG1', and a first nona blue pixel group NBG1'. Here, each pixel group may share a different respective floating diffusion FD. For example, the first nona green pixel group NGG1' may share one floating diffusion FD, the second nona green pixel group NGG2' may share another floating diffusion FD, the first nona red pixel group NRG1' may share yet another floating diffusion FD, and the first nona blue pixel group NBG1' may share yet another floating diffusion FD. Here, the pixel array PA' corresponds to a nona pattern.

Referring to FIG. 9, a pixel signal SIG_PX generated from the pixel array PA' may be transmitted to the image signal processor 900 through the readout circuit 1150 and the buffer 1170. The readout circuit 1150 may include a binning determiner 1151, a CDS 1152, and an analog-to-digital converter (ADC) 1153. The binning determiner 1151 may receive the pixel signal SIG_PX output from the pixel array PA'. For example, the binning determiner 1151 may receive the pixel signal SIG_PX including a plurality of pixel values from the first nona green pixel group NGG1'. The binning determiner 1151 may determine whether to perform a binning operation on the pixel signal SIG_PX. When the binning determiner 1151 determines to perform a binning operation, it may perform an analog binning operation on the pixel signal SIG_PX. When the binning determiner 1151 determines not to perform a binning operation, it may transmit the pixel signal SIG_PX to the CDS 1152. In an embodiment, it will be assumed that the binning determiner 1151 does not operate, and an unbinned pixel signal SIG_PX is output.

The pixel signal SIG_PX converted through the CDS 1152 and the ADC 1153 may be provided to the buffer 1170. The buffer 1170 may buffer the pixel signal SIG_PX and transmit the buffered pixel signal SIG_PX to the image signal processor 900.

The image signal processor 900 may include a bad pixel corrector 910 and a remosaic module 920. Here, the image signal processor 900 may correspond to a host connected to the image sensor 100. The image signal processor 900 may receive the pixel signal SIG_PX from the buffer 1170.

The bad pixel corrector 910 may generate a corrected pixel signal SIG_PX_C based on the pixel signal SIG_PX. That is, the bad pixel corrector 910 may determine a bad pixel from the pixel signal SIG_PX and correct a bad pixel signal (e.g., a bad image signal) corresponding to the determined bad pixel to a normal pixel signal. That is, the bad pixel corrector 910 may generate the corrected pixel signal SIG_PX_C having a normal pixel signal by ignoring the bad pixel signal and referring to other pixel signals. Here, the bad pixel corrector 910 may correct only the pixel signal SIG_PX determined to be a bad pixel and may not correct other pixel signals SIG_PX. Information about bad pixel signals may be stored in a nonvolatile memory of the image signal processor 900.

The remosaic module 920 may receive the corrected pixel signal SIG_PX_C from the bad pixel corrector 910. The remosaic module 920 may remosaic the corrected pixel signal SIG_PX_C. Here, the remosaicing may be an operation of outputting a high-quality image signal IMS by using the pixel signal SIG_PX or the corrected pixel signal SIG_PX_C. That is, the remosaic module 920 may correct the pixel signal SIG_PX having a nona pattern to the image signal IMS having a Bayer pattern. Here, the Bayer pattern of the image signal IMS may correspond to a second pattern. The second pattern may be a higher frequency pattern than the first pattern corresponding to the nona pattern. After processing by the remosaic module 920, the image signal IMS may be demosaiced. The demosaiced image signal IMS may have pixel values of all colors for each pixel. Therefore, a high-quality image signal IMS may be output.

Figure 10:
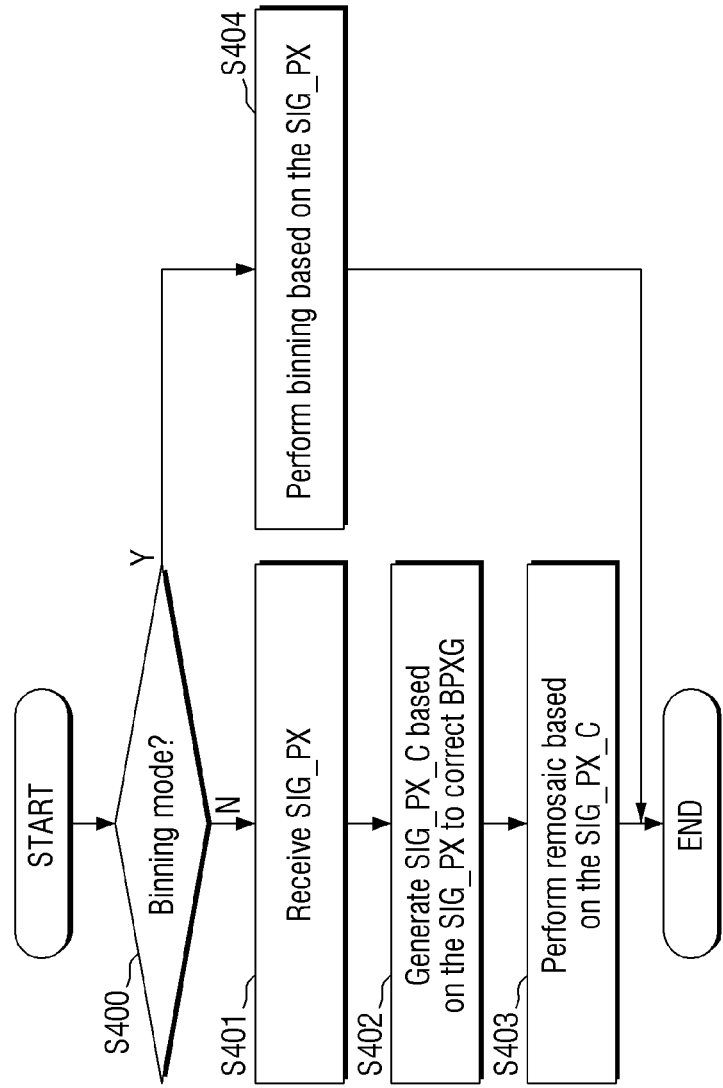
FIG. 10 is a flowchart illustrating a method of operating an image sensing device according to an embodiment.
Figure 11:
FIG. 11 is a diagram for explaining generation of a corrected pixel signal according to an embodiment.

FIG. 10 is a flowchart illustrating a method of operating an image sensing device according to embodiments. FIG. 11 is a diagram for explaining generation of a corrected pixel signal according to embodiments.

Referring to FIGS. 10 and 11, the image sensor 100 and the image signal processor 900 may determine whether a current mode is a binning mode (operation S400). For example, the binning determiner 1151 of the readout circuit 1150 of the image sensor 100 may determine whether to perform analog binning, and the image signal processor 900 may determine whether to perform digital binning.

When it is determined that the current mode is the binning mode (operation S400-Y), the image sensor 100 and the image signal processor 900 may perform binning based on a pixel signal SIG_PX (operation S404). That is, the binning determiner 1151 (e.g., a binning unit) may output a binning pixel signal by performing binning on pixel values included in the pixel signal SIG_PX, and the image signal processor 900 may output an image signal IMS by performing digital binning on the binning pixel signal. Here, the image quality of the output image signal IMS may be lower than the original image quality. In addition, the image sensing device 1 may operate in the binning mode when used in a low-illuminance environment.

When it is determined that the current mode is not the binning mode (operation S400-N), the image signal processor 900 may receive the pixel signal SIG_PX (operation S401). For example, the bad pixel corrector 910 may receive the pixel signal SIG_PX from the image sensor 100. Here, the pixel signal SIG_PX may be a signal on which analog binning has not been performed.

For example, the pixel signal SIG_PX may include a plurality of pixel values illustrated in FIG. 11. Here, the pixel values may correspond to the pixel array PA or the pixel array PA' of the image sensor 100. In FIG. 11, for example, the pixel values correspond to the pixel array PA. The pixel signal SIG_PX may include a plurality of green pixel values G1S through G45S, a plurality of red pixel values R1S through R18S, and a plurality of blue pixel values B1S through B18S. The pixel values may correspond to the green pixels G1 through G45, the red pixels R1 through R18, and the blue pixels B1 through B18 of the pixel array PA, respectively. In addition, the pixel values of the pixel signal SIG_PX may correspond to the nona green pixel groups NGG1 through NGG5, the nona blue pixel groups NBG1 and NBG2, and the nona red pixel groups NRG1 and NRG2.

Here, the second nona green pixel group NGG2 may be determined to be bad pixels, and tenth through eighteenth green pixel values G10S through G18S output from the second nona green pixel group NGG2 may be determined to be a bad pixel group signal BPXG. Due to a defect in the pixel array PA of the image sensor 100, the second nona green pixel group NGG2 may have a problem, and the tenth through eighteenth green pixel values G10S through G18S output from the second nona green pixel group NGG2 may have errors. Therefore, it is necessary to correct the errors of the tenth through eighteenth green pixel values G10S through G18S corresponding to the bad pixel group signal BPXG.

Referring back to FIGS. 9 and 10, the bad pixel corrector 910 may generate a corrected pixel signal SIG_PX_C based on the pixel signal SIG_PX and may correct the bad pixel group signal BPXG (operation S402). Referring to FIG. 11, the bad pixel corrector 910 may generate a corrected pixel group signal CPXG by correcting the bad pixel group signal BPXG of the pixel signal SIG_PX. Here, the corrected pixel group signal CPXG may be included in the corrected pixel signal SIG_PX_C. The corrected pixel signal SIG_PX_C may include pixel values G1S through G9S, G19S through G45S, R1S through R18S and B1S through B18S on which bad pixel correction has not been performed and the corrected pixel group signal CPXG on which bad pixel correction has been performed.

The bad pixel corrector 910 may replace the bad pixel group signal BPXG (e.g., G10S through G18S) with the corrected pixel group signal CPXG based on pixel values of pixel signals other than the bad pixel group signal BPXG. That is, the corrected pixel group signal CPXG may be generated based on the pixel values G1S through G9S, G19S through G45S, R1S through R18S and B1S through B18S. This will be described in more detail later.

The corrected pixel group signal CPXG may include first through fifth corrected green pixel values CG1S through CG5S for a green color, first and second corrected red pixel values CR1S and CR2S for a red color, and first and second corrected blue pixel values CB1S and CB2S for a blue color. While the bad pixel group signal BPXG includes the tenth through eighteenth green pixel values G10S through G18S for the green color, the corrected pixel group signal CPXG may include pixel values for all of the green color, the red color, and the blue color. That is, the bad pixel corrector 910 may generate the corrected pixel group signal CPXG by performing bad pixel correction on the bad pixel group signal BPXG for one color. Here, the corrected pixel group signal CPXG may correspond to a Bayer pattern. That is, the bad pixel corrector 910 may change the bad pixel group signal BPXG corresponding to a nona pattern to the corrected pixel group signal CPXG corresponding to the Bayer pattern. Here, the Bayer pattern of the corrected pixel group signal CPXG may correspond to a second pattern. The second pattern may correspond to a higher frequency pattern than a first pattern corresponding to the nona pattern.

By generating the corrected pixel group signal CPXG corresponding to the Bayer pattern at once (e.g., by performing both correction and remosaicing at the same time) instead of performing bad pixel correction to change the bad pixel group signal BPXG into corrected pixel values for one color and then performing remosaicing, image processing efficiency can be improved. In addition, since bad pixel correction is performed based not on interpolated, corrected bad pixel values for one color but on other surrounding pixel values, the occurrence of errors in the generated corrected pixel group signal CPXG can be reduced.

Figure 12:
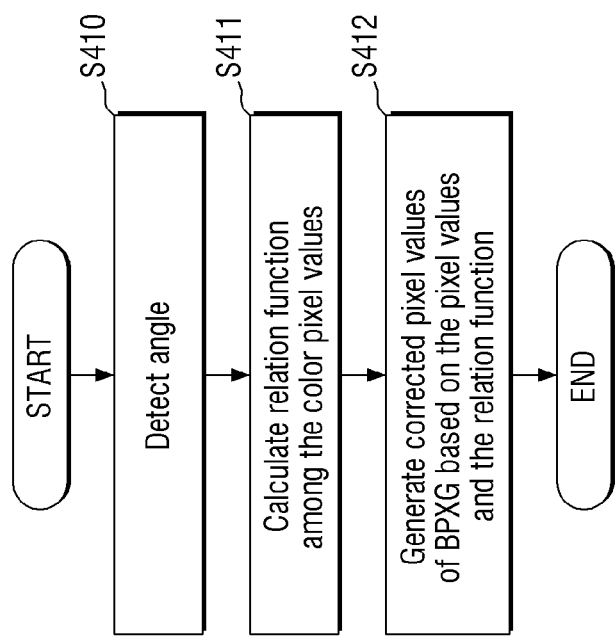
FIG. 12 is a flowchart illustrating an image signal processing method according to an embodiment.
Figure 13:
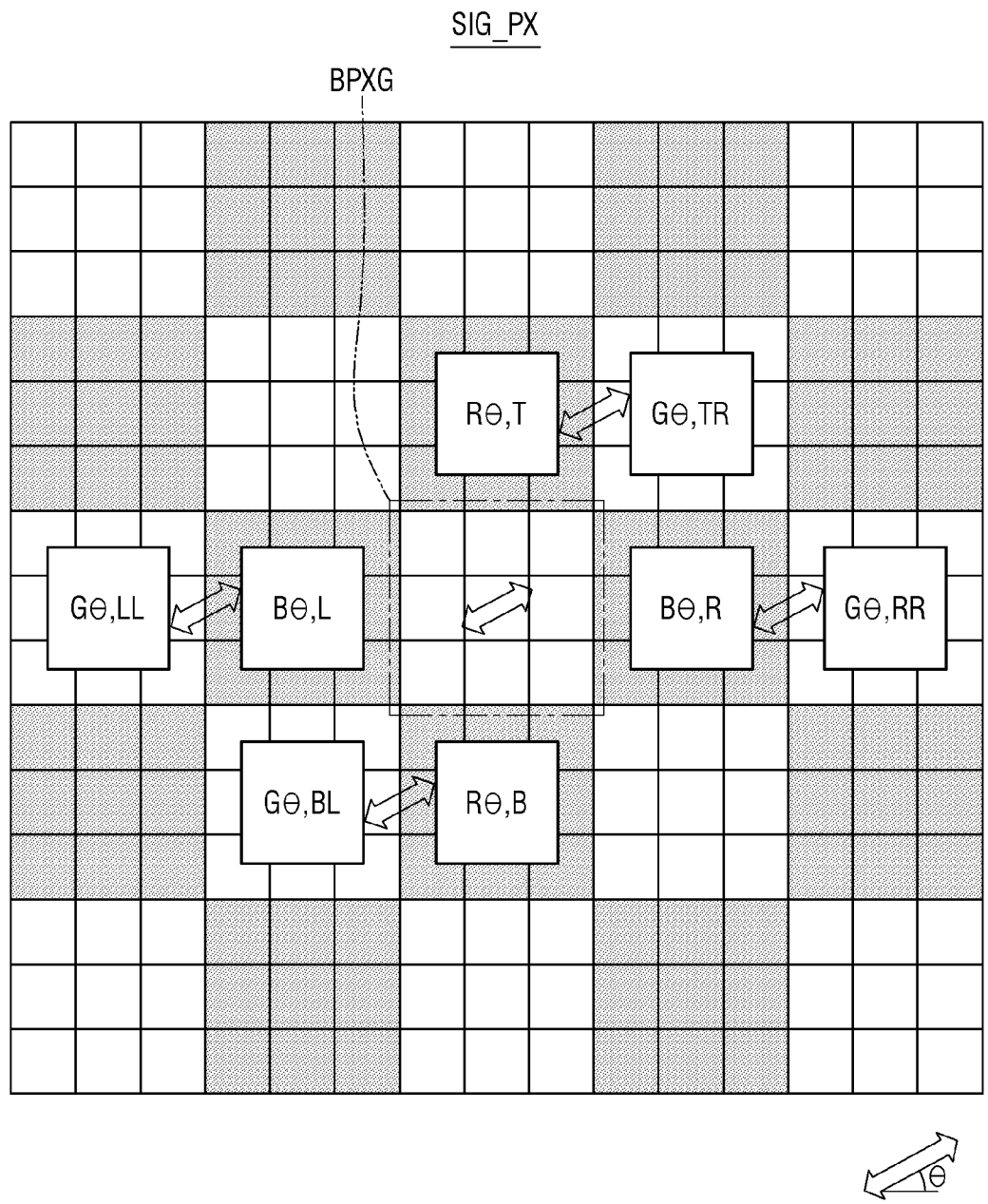
FIGS. 13 and 14 are diagrams for explaining the image signal processing method of FIG. 12.
Figure 14:
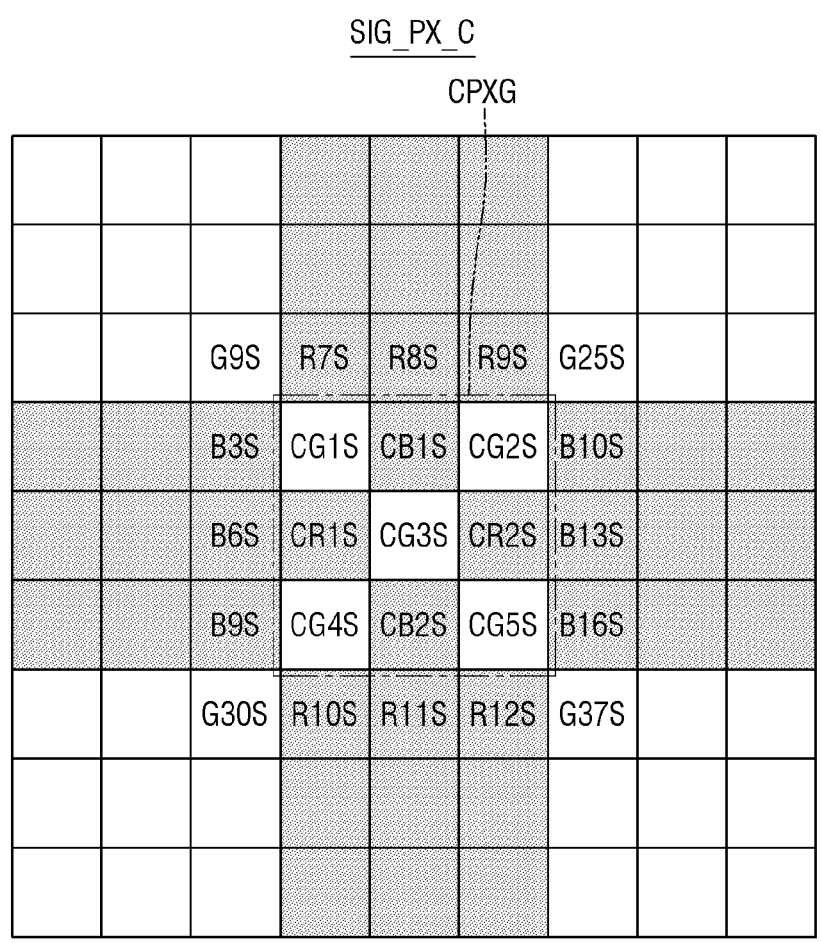

FIG. 12 is a flowchart illustrating an image signal processing method according to embodiments. FIGS. 13 and 14 are diagrams for explaining the image signal processing method of FIG. 12.

Referring to FIGS. 12 through 14, the image sensing device 1 may detect an angle θ (operation S410). For example, the image signal processor 900 may detect the angle θ of a corresponding image from a pixel signal SIG_PX. Here, the angle θ of the image may correspond to a unique characteristic of the image. For example, the angle θ may be defined as an angle value between 0 degrees and 90 degrees. Here, the angle θ is assumed to be an acute angle, but embodiments are not limited thereto.

The pixel signal SIG_PX may include a bad pixel group signal BPXG and other pixel values around the bad pixel group signal BPXG. For example, the pixel signal SIG_PX may include a left blue pixel value (Bθ, L) and a left green pixel value (Gθ, LL) corresponding to a left side of the bad pixel group signal BPXG. For example, the pixel signal SIG_PX may include a right blue pixel value (Bθ, R) and a right green pixel value (Gθ, RR) corresponding to a right side of the bad pixel group signal BPXG. For example, the pixel signal SIG_PX may include a top red pixel value (Rθ, T) and a top right green pixel value (Gθ, TR) corresponding to an upper side of the bad pixel group signal BPXG. For example, the pixel signal SIG_PX may include a bottom red pixel value (Rθ, B) and a bottom left green pixel value (Gθ, BL) corresponding to a lower side of the bad pixel group signal BPXG.

Here, pixels PX corresponding to the left blue pixel value (Bθ, L), the left green pixel value (Gθ, LL), the right blue pixel value (Bθ, R), the right green pixel value (Gθ, RR), the top red pixel value (Rθ, T), the top right green pixel value (Gθ, TR), the bottom red pixel value (Rθ, B), and the bottom left green pixel value (Gθ, BL) may be adjacent to pixels PX corresponding to the bad pixel group signal BPXG. That is, the image signal processor 900 may calculate pixel values corresponding to all colors.

The image signal processor 900 may calculate a relation among the above color pixel values (operation S411).

Referring to FIG. 13, the image signal processor 900 may calculate relations between the left blue pixel value (Bθ, L), the left green pixel value (Gθ, LL), the right blue pixel value (Bθ, R), the right green pixel value (Gθ, RR), the top red pixel value (Rθ, T), the top right green pixel value (Gθ, TR), the bottom red pixel value (Rθ, B), and the bottom left green pixel value (Gθ, BL).

For example, the green pixel values and the blue pixel values may be linearly expressed as in Equation 1 below.

$$(G\theta, LL \quad G\theta, RR) = (a_{\theta,B2G} \quad b_{\theta,B2G}) \begin{pmatrix} B\theta, L & B\theta, R \\ 1 & 1 \end{pmatrix}. \quad (1)$$

That is, the left green pixel value (Gθ, LL) may be expressed as a relation to the left blue pixel value (Bθ, L), and the right green pixel value (Gθ, RR) may be expressed as a relation to the right blue pixel value (Bθ, R).

In addition, the green pixel values and the red pixel values may be linearly expressed as in Equation 2 below.

$$(G\theta, BL \quad G\theta, TR) = (a_{\theta,R2G} \quad b_{\theta,R2G}) \begin{pmatrix} R\theta, T & R\theta, B \\ 1 & 1 \end{pmatrix} \quad$$

That is, the bottom left green pixel value (Gθ, BL) may be expressed as a relation to the top red pixel value (Rθ, T), and the top right green pixel value (Gθ, TR) may be expressed as a relation to the bottom red pixel value (Rθ, B).

A relation of a pixel value for a green color to a pixel value for a blue color derived through this is as shown in Equation 3 below.

$$\hat{G} = f_{\theta,B2G}(B) = a_{\theta,B2G}B\theta, L + b_{\theta,B2G}, \quad (3)$$

where $f_{\theta,B2G}(B)$ is a function for converting a blue pixel value into a green pixel value.

In addition, a relation of a pixel value for the green color to a pixel value for a red color is as shown in Equation 4 below.

$$\hat{G} = f_{\theta,R2G}(R) = a_{\theta,R2G}R\theta, T + b_{\theta,R2G}, \quad (4)$$

where $f_{\theta,R2G}(R)$ is a function for converting a red pixel value into a green pixel value.

That is, the image signal processor 900 may calculate the relations $f_{\theta,B2G}(B)$ and $f_{\theta,R2G}(R)$ by using pixel values of the pixel signal SIG_PX. In addition, conversion of pixel values between channels may be performed using these relations.

Referring to FIGS. 12 and 14, the image signal processor 900 may generate corrected pixel values of the bad pixel group signal BPXG based on the pixel values and the relations (operation S412).

Referring to FIG. 14, the image signal processor 900 may generate a corrected pixel group signal CPXG by using surrounding pixel values R7S through R9S, R10S through R12S, G9S, G25S, G30S, G37S, B3S, B6S, B9S, B10S, B13S and B16S. That is, the image signal processor 900 may generate pixel values CG1S through CG5S, CB1S, CB2S, CR1S and CR2S of the corrected pixel group signal CPXG by using surrounding pixel values and calculated relations.

For example, a second corrected green pixel value CG2S of the corrected pixel group signal CPXG may be generated using Equation 5 below.

$$CG2S = M_{right} \begin{pmatrix} G25S \\ f_{\theta,B2G}(B10S) \\ f_{\theta,B2G}(B13S) \end{pmatrix}. \quad (5)$$

That is, the second corrected green pixel value CG2S may be calculated using a twenty-fifth green pixel value G25S, a tenth blue pixel value B10S, a thirteenth blue pixel value B13S, and a blue color-green color relation. Here, $M_{right}$ when a pixel value located on a right side of the second corrected green pixel value CG2S is referred to and $M_{left}$ when a pixel value located on a left side of the second corrected green pixel value CG2S is referred to are as shown in Equation 6 below.

$$M_{right} = \begin{pmatrix} \max(\tan\theta, 0) \\ 1 - |\tan\theta| \\ \max(-\tan\theta, 0) \end{pmatrix}^T, \quad (6)$$

-continued $$M_{left} = \begin{pmatrix} \max(-\tan\theta, 0) \\ 1 - |\tan\theta| \\ \max(\tan\theta, 0) \end{pmatrix}^T.$$

For example, a second corrected red pixel value CR2S of the corrected pixel group signal CPXG may be generated using Equation 7 below.

$$CR2S = M_{right} \begin{pmatrix} f_{\theta,R2G}^{-1}(f_{\theta,B2G}(B10S)) \\ f_{\theta,R2G}^{-1}(f_{\theta,B2G}(B13S)) \\ f_{\theta,R2G}^{-1}(f_{\theta,B2G}(B16S)) \end{pmatrix}. \quad (7)$$

That is, the second corrected red pixel value CR2S may be calculated using the tenth blue pixel value B10S, the thirteenth blue pixel value B13S, a sixteenth blue pixel value B16S, a blue color-green color relation, and a red color-green color relation.

Through this process, a first corrected green pixel value CG1S, the second corrected green pixel value CG2S, a fourth corrected green pixel value CG4S, a fifth corrected green pixel value CG5S, a first corrected red pixel value CR1S, and the second corrected red pixel value CR2S located on the periphery may be calculated.

Then, corrected pixel values located in the center may be calculated using the calculated corrected pixel values and relations.

For example, a first corrected blue pixel value CB1S of the corrected pixel group signal CPXG may be generated using Equation 8 below.

$$CB1S = \quad (8)$$

$$0.5M_{left} \begin{pmatrix} f_{\theta,B2G}^{-1}(f_{\theta,R2G}(R7S)) \\ f_{\theta,B2G}^{-1}(CG1S) \\ f_{\theta,B2G}^{-1}(f_{\theta,R2G}(CR1S)) \end{pmatrix} + 0.5M_{right} \begin{pmatrix} f_{\theta,B2G}^{-1}(f_{\theta,R2G}(R9S)) \\ f_{\theta,B2G}^{-1}(CG2S) \\ f_{\theta,B2G}^{-1}(f_{\theta,R2G}(CR2S)) \end{pmatrix}.$$

That is, the first corrected blue pixel value CB1S may be calculated using a seventh red pixel value R7S, a ninth red pixel value R9S, the first corrected green pixel value CG1S, the second corrected green pixel value CG2S, the first corrected red pixel value CR1S, the second corrected red pixel value CR2S, a blue color-green color relation, and a red color-green color relation.

Through this process, the first corrected blue pixel value CB1S, a second corrected blue pixel value CB2S, and a third corrected green pixel value CG3S located in the center may be calculated. In further detail, the third corrected green pixel value CG3S located in the center may be calculated as a function of the previously calculated values CG1S, CR1S, CG4S, CG2S, CR2S, and CG5S.

Through the above method, pixel values included in the corrected pixel group signal CPXG may be calculated. Accordingly, since pixel values for all colors are generated, there is no need to remosaic the pixel values. Therefore, the image processing efficiency can be improved. In addition, since the bad pixel group signal BPXG is not corrected to pixel values for one color, errors in bad pixel correction can be reduced.

Referring back to FIG. 10, the remosaic module 920 may perform remosaicing based on the corrected pixel signal SIG_PX_C (operation S403). Here, the corrected pixel signal SIG_PX_C may include the corrected pixel group signal CPXG corrected by the bad pixel corrector 910 and the pixel values G1S through G9S, G19S through G45S, R1S through R18S, and B1S through B18S not corrected by the bad pixel corrector 910.

Figure 15:
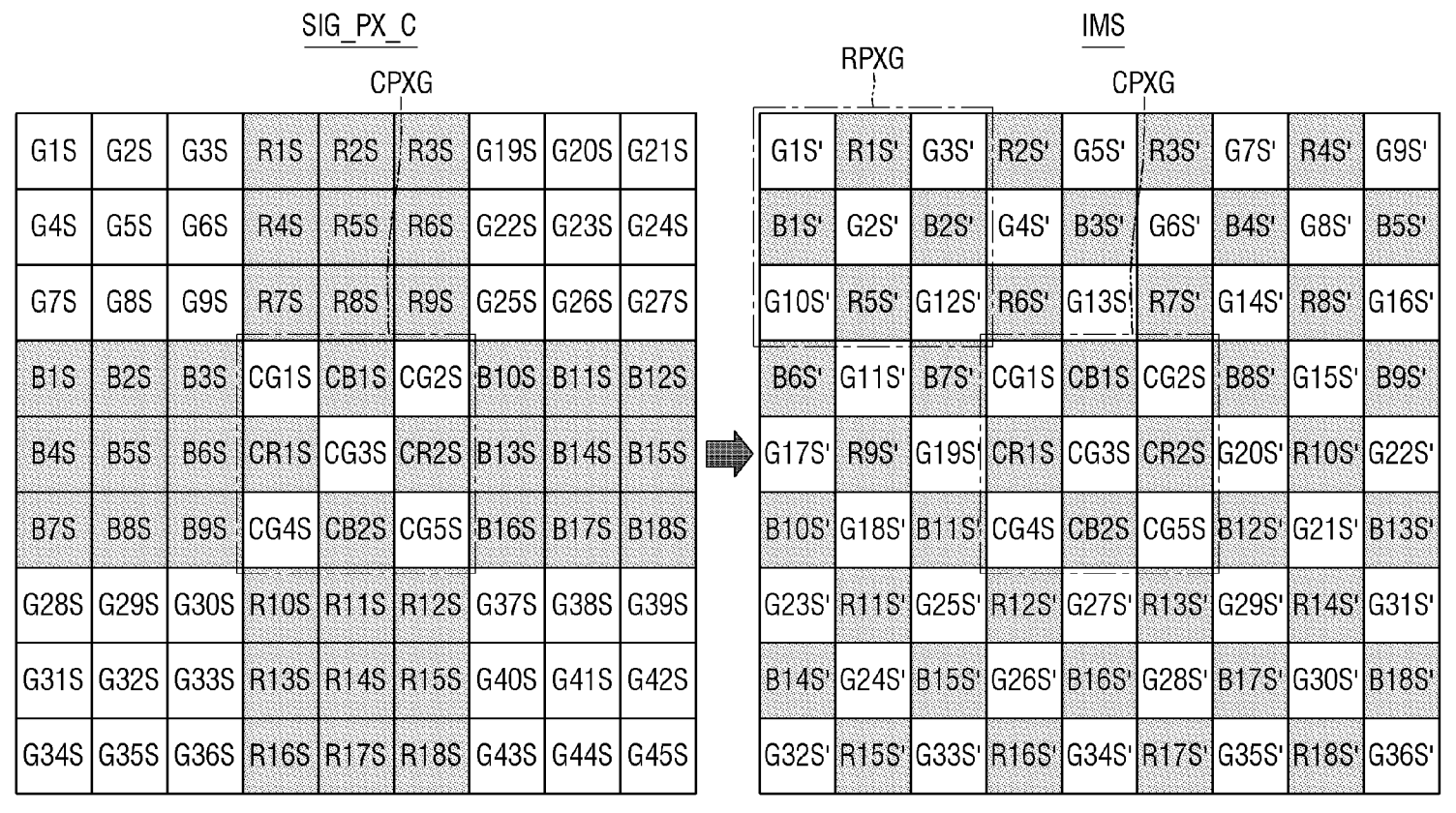

FIG. 15 is a diagram for explaining generation of an image signal according to embodiments.

Referring to FIG. 15, the remosaic module 920 may remosaic pixel values of the corrected pixel signal SIG_PX_C except for the corrected pixel group signal CPXG. An image signal IMS generated by the remosaic module 920 may include first through thirty-sixth green pixel values G1S' through G36S', first through eighteenth blue pixel values B1S' through B18S', and first through eighteenth red pixel values R1S' through R18S' corresponding to an RGB Bayer pattern. In addition, the image signal IMS may include the corrected pixel group signal CPXG included in the corrected pixel signal SIG_PX_C. Here, the remosaiced first through thirty-sixth green pixel values G1S' through G36S', first through eighteenth blue pixel values B1S40 through B18S' and first through eighteenth red pixel values R1S' through R18S' and the corrected pixel group signal CPXG may correspond to a Bayer pattern. That is, the first through thirty-sixth green pixel values G1S' through G36S', the first through eighteenth blue pixel values B1S' through B18S', and the first through eighteenth red pixel values R1S' through R18S' may include pixel values for three colors.

For example, a remosaiced pixel group signal RPXG (see, e.g., FIG. 15) may include the first green pixel value G1S', the second green pixel value G2S', the third green pixel value G3S', the tenth green pixel value G10S', the twelfth green pixel value G12S', the first blue pixel value B1S', the second blue pixel value B2S', the first red pixel value R1S', and the fifth red pixel value R5S'. Each pixel value may correspond to an RGB Bayer pattern. Next, the image signal processor 900 may demosaic the image signal IMS, and the demosaiced image signal IMS may be output through a display. Accordingly, an image having bad pixels corrected and having improved image quality may be output.

An image signal processing method according to embodiments will now be described with reference to FIGS. 16 and 17.

Figure 16:
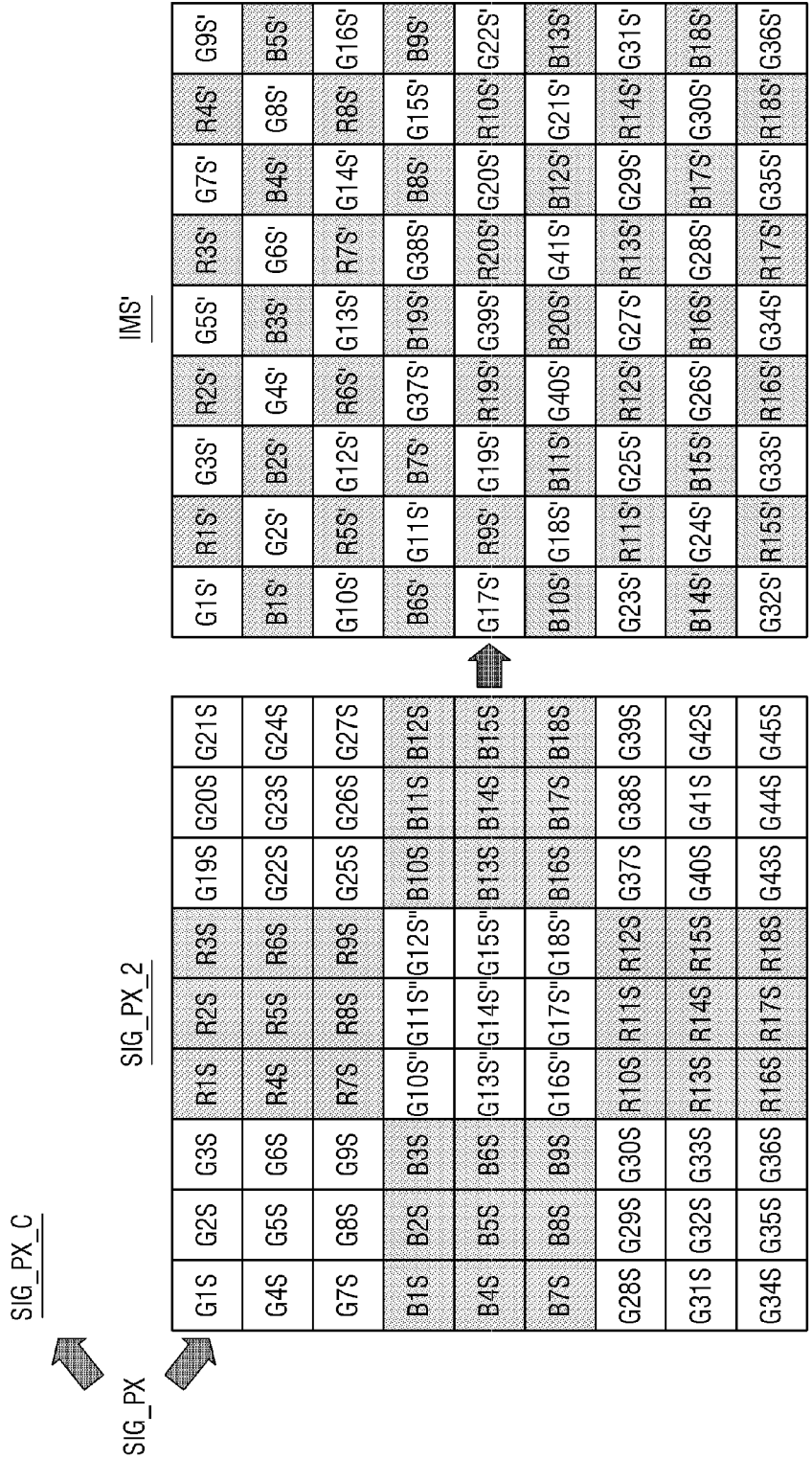
FIGS. 16 and 17 are diagrams for explaining an image signal processing method according to an embodiment.
Figure 17:
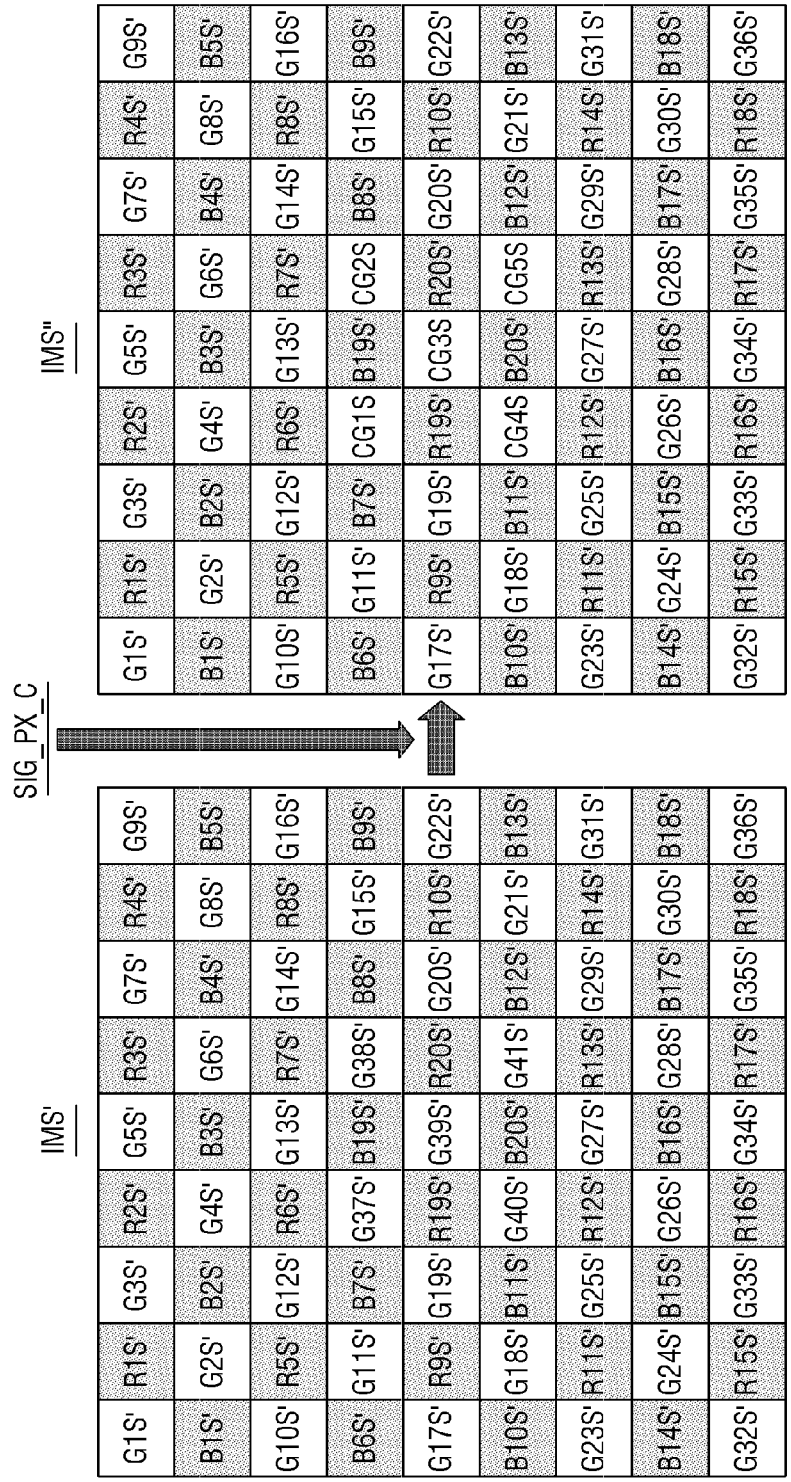

FIGS. 16 and 17 are diagrams for explaining an image signal processing method according to embodiments. For ease of description, a description of the same elements and features as those described with reference to FIGS. 1 through 15 will be given briefly or omitted.

Referring to FIGS. 16 and 17, an image signal processor 900 may generate a corrected pixel signal SIG_PX_C based on a pixel signal SIG_PX. This process is the same as that described with reference to FIGS. 1 through 15. The image signal processor 900 may generate a pixel signal SIG_PX_2 by correcting a bad pixel group signal BPXG to pixel values for one color. Here, the pixel signal SIG_PX_2 may include tenth through eighteenth corrected green pixel values G10S" through G18S". That is, the image signal processor 900 may generate pixel values for one color without generating pixel values for a plurality of colors. Here, the tenth through eighteenth corrected green pixel values G10S" through G18S" may be generated with reference to first through ninth green pixel values G1S through G9S and nineteenth through forty-fifth green pixel values G19S through G45S around them.

The image signal processor 900 may generate an image signal IMS' by remosaicing the pixel signal SIG_PX_2. Here, the image signal IMS' may be generated with reference to the tenth through eighteenth corrected green pixel values G10S" through G18S".

As shown, e.g., in FIG. 17, the image signal processor 900 may generate an image signal IMS" by correcting the image signal IMS' using the corrected pixel signal SIG_PX_C. For example, thirty-seventh through forty-first green pixel values G37S' through G41S' of the image signal IMS' may be replaced with first through fifth corrected green pixel values CG1S through CG5S of the corrected pixel signal SIG_PX_C. That is, the image signal IMS' generated using a conventional method may be corrected using the corrected pixel signal SIG_PX_C.

A pixel signal processing method according to embodiments will now be described with reference to FIG. 18.

Figure 18:
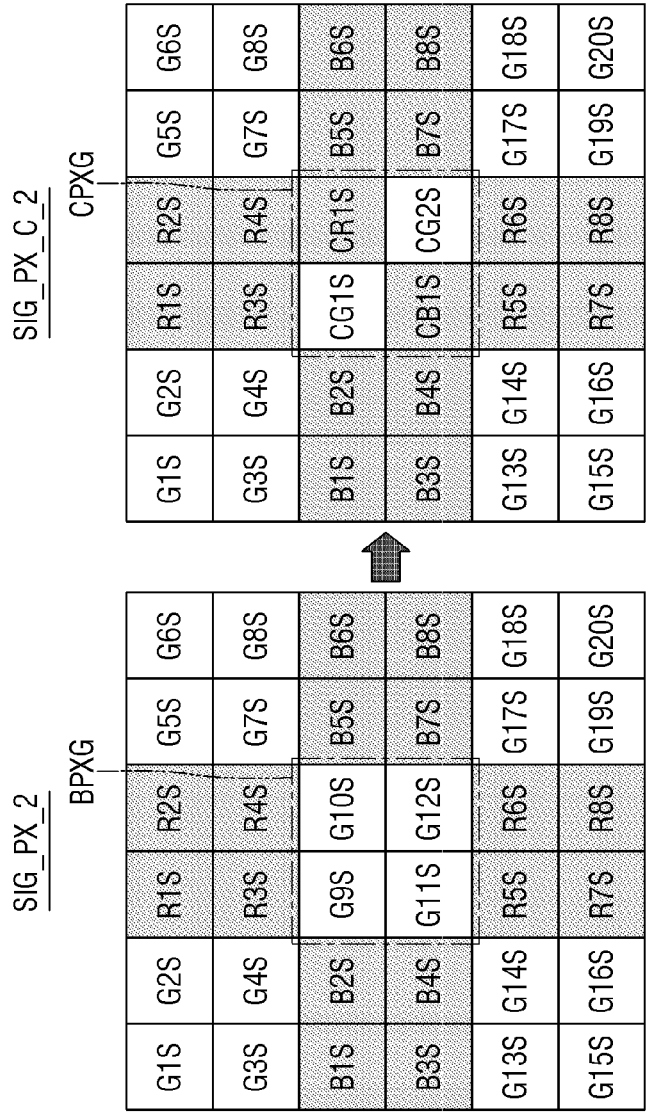
FIG. 18 is a diagram for explaining a pixel signal processing method according to an embodiment.

FIG. 18 is a diagram for explaining a pixel signal processing method according to embodiments. For ease of description, a description of the same elements and features as those described with reference to FIGS. 1 through 17 will be given briefly or omitted.

Referring to FIG. 18, an image signal processor 900 may generate a corrected pixel signal SIG_PX_C_2 by performing bad pixel correction on a pixel signal SIG_PX_2. Here, the pixel signal SIG_PX_2 may correspond to a tetra pattern. That is, a pixel array PA of an image sensor 100 outputting the pixel signal SIG_PX_2 may be arranged in a tetra pattern. Accordingly, the pixel signal SIG_PX_2 may include first through twentieth green pixel values G1S through G20S, first through eighth red pixel values R1S through R8S, and first through eighth blue pixel values B1S through B8S. Here, the ninth through twelfth green pixel values G9S through G12S may correspond to a bad pixel group signal BPXG.

The image signal processor 900 may replace the bad pixel group signal BPXG with a corrected pixel group signal CPXG. Here, the corrected pixel group signal CPXG may be generated using pixel values other than the bad pixel group signal BPXG. The corrected pixel group signal CPXG may include a first corrected green pixel value CG1S, a second corrected green pixel value CG2S, a first corrected red pixel value CR1S, and a first corrected blue pixel value CB1S. Pixels of the pixel array PA which correspond to the first corrected green pixel value CG1S, the second corrected green pixel value CG2S, the first corrected red pixel value CR1S, and the first corrected blue pixel value CB1S may be arranged in an RGB Bayer pattern. However, embodiments are not limited thereto.

In summary, the image signal processor 900 may generate the corrected pixel group signal CPXG corresponding to the RGB Bayer pattern by performing bad pixel correction on the pixel signal SIG_PX_2 corresponding to the tetra pattern. While the bad pixel group signal BPXG is for one color, the corrected pixel group signal CPXG is for a plurality of colors.

Pixel signal processing methods according to embodiments will now be described with reference to FIGS. 19 and 20.

Figure 19:
FIG. 19 is a diagram for explaining a pixel signal processing method according to an embodiment.

FIG. 19 is a diagram for explaining a pixel signal processing method according to embodiments. FIG. 20 is a diagram for explaining a pixel signal processing method according to embodiments. For ease of description, a description of the same elements and features as those described with reference to FIGS. 1 through 17 will be given briefly or omitted.

Referring to FIG. 19, an image signal processor 900 may generate a corrected pixel signal SIG_PX_C_3 by performing bad pixel correction on a pixel signal SIG_PX_3. Here, the pixel signal SIG_PX_3 may correspond to a 4×4 pattern.

That is, a pixel array PA of an image sensor 100 outputting the pixel signal SIG_PX_3 may be arranged in a 4×4 pattern. Accordingly, the pixel signal SIG_PX_3 may include first through thirty-second green pixel values G1S through G32S, first through sixteenth red pixel values R1S through R16S, and first through sixteenth blue pixel values B1S through B16S. Here, the seventeenth through thirty-second green pixel values G17S through G32S may correspond to a bad pixel group signal BPXG.

The image signal processor 900 may replace the bad pixel group signal BPXG with a corrected pixel group signal CPXG. Here, the corrected pixel group signal CPXG may be generated using pixel values other than the bad pixel group signal BPXG. The corrected pixel group signal CPXG may include first through eighth corrected green pixel values CG1S through CG8S, first through fourth corrected blue pixel values CB1S through CB4S, and first through fourth corrected red pixel values CR1S through CR4S. That is, the corrected pixel group signal CPXG may include all pixel values for a red color, a green color, and a blue color.

In summary, the image signal processor 900 may generate the corrected pixel group signal CPXG corresponding to an RGB Bayer pattern by performing bad pixel correction on the pixel signal SIG_PX_3 corresponding to the 4×4 pattern.

Figure 20:
FIG. 20 is a diagram for explaining a pixel signal processing method according to an embodiment.

Referring to FIG. 20, an image signal processor 900 may generate a corrected pixel signal SIG_PX_C_3' by performing bad pixel correction on a pixel signal SIG_PX_3. The corrected pixel signal SIG_PX_C_3' may include a corrected pixel group signal CPXG. The corrected pixel group signal CPXG may include pixel values corresponding to a 2×2 pattern. For example, the corrected pixel group signal CPXG may include first through fourth corrected green pixel values CG1S through CG4S, first through fourth corrected red pixel values CR1S through CR4S, first through fourth corrected blue pixel values CB1S through CB4S, and fifth through eighth corrected green pixel values CG5S through CG8S. That is, the image signal processor 900 may generate corrected pixel values corresponding to the 2×2 pattern by performing bad pixel correction on pixel values corresponding to a 4×4 pattern. However, embodiments are not limited thereto.

An image signal processing method according to embodiments will now be described with reference to FIGS. 21 through 23.

Figure 21:
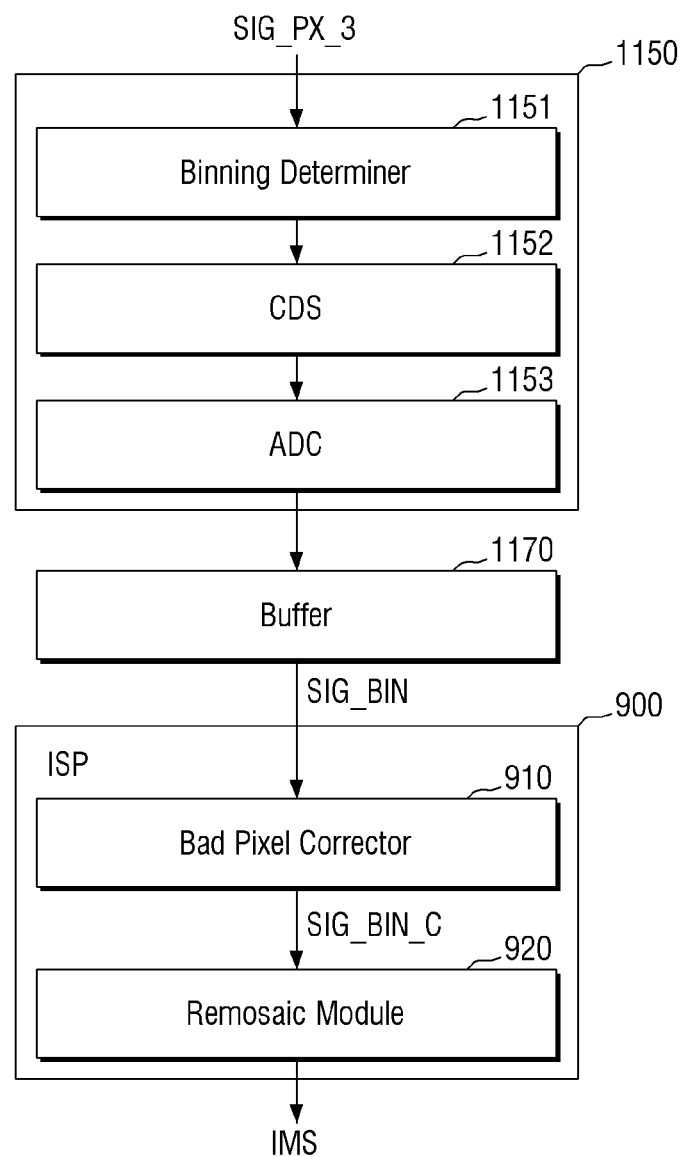
FIG. 21 is a block diagram of an image signal processor 900 according to an embodiment.

FIG. 21 is a block diagram of an image signal processor 900 according to embodiments. FIGS. 22 and 23 are diagrams for explaining an image signal processing method according to FIG. 21. For ease of description, a description of the same elements and features as those described with reference to FIGS. 1 through 17 will be given briefly or omitted.

Referring to FIG. 21, a readout circuit 1150 may receive a pixel signal SIG_PX_3 from a pixel array PA. Here, the pixel signal SIG_PX_3 may correspond to the pixel signal SIG_PX_3 described with reference to FIGS. 19 and 20. That is, the pixel array PA may include pixels arranged in a 4×4 pattern.

Figure 22:
FIGS. 22 and 23 are diagrams for explaining an image signal processing method according to FIG. 21.

Referring to FIGS. 21 and 22, a binning determiner 1151 may generate a binning pixel signal SIG_BIN by performing binning on the pixel signal SIG_PX_3. That is, four pixel values among pixel values included in the pixel signal SIG_PX_3 may be binned to generate one pixel value. For example, a first green pixel value G1S, a second green pixel value G2S, a fifth green pixel value G5S, and a sixth green pixel value G6S may be binned to generate a first binning green pixel value BG1S. The first binning green pixel value BG1S may be the sum of the first green pixel value G1S, the second green pixel value G2S, the fifth green pixel value G5S, and the sixth green pixel value G6S.

That is, the binning determiner 1151 may generate first through eighth binning green pixel values BG1S through BG8S, first through fourth binning red pixel values BR1S through BR4S, and first through fourth binning blue pixel values BB1S through BB4S based on first through thirty-second green pixel values G1S through G32S, first through sixteenth red pixel values R1S through R16S, and first through sixteenth blue pixel values B1S through B16S, respectively. Pixel values of the binning pixel signal SIG_BIN may correspond to a tetra Bayer pattern, but embodiments are not limited thereto.

Figure 23:
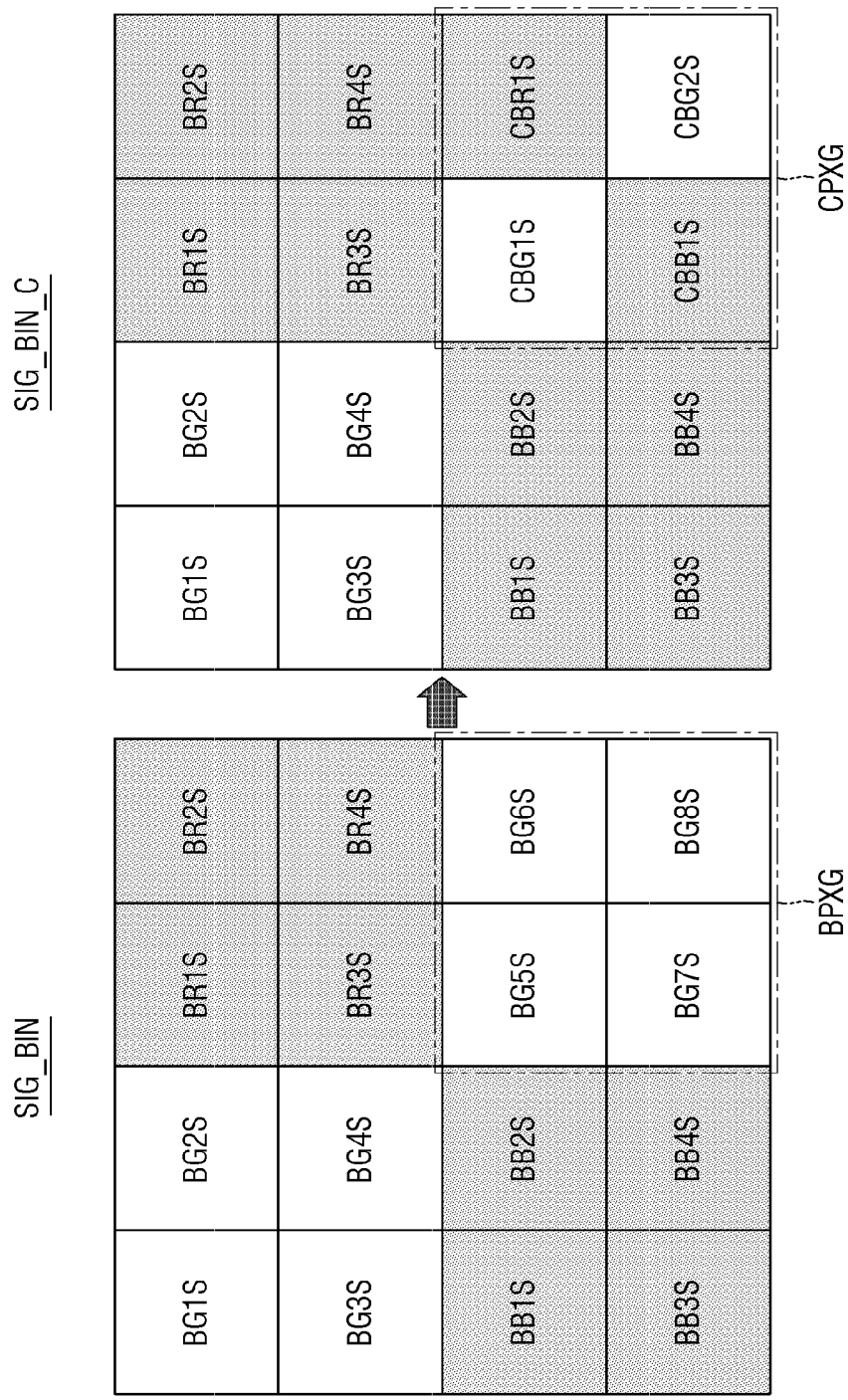

Referring to FIGS. 21 and 23, the image signal processor 900 may receive the binning pixel signal SIG_BIN. A bad pixel corrector 910 may generate a corrected pixel signal SIG_BIN_C by performing bad pixel correction on the binning pixel signal SIG_BIN. Here, the corrected pixel signal SIG_BIN_C may include a corrected pixel group signal CPXG. The corrected pixel group signal CPXG may include pixel values CBG1S, CBG2S, CBR1S and CBB1S for a red color, a blue color, and a green color. Then, the other pixel values may be remosaiced.

A pixel signal processing method according to embodiments will now be described with reference to FIG. 24.

Figure 24:
FIG. 24 is a diagram for explaining a pixel signal processing method according to an embodiment.

FIG. 24 is a diagram for explaining a pixel signal processing method according to embodiments. For ease of description, a description of the same elements and features as those described with reference to FIGS. 1 through 17 will be given briefly or omitted.

Referring to FIG. 24, an image signal processor 900 may generate a corrected pixel signal SIG_PX_C_4 by performing bad pixel correction on a pixel signal SIG_PX_4. Here, the pixel signal SIG_PX_4 may correspond to a 5×5 pattern. That is, a pixel array PA of an image sensor 100 outputting the pixel signal SIG_PX_4 may be arranged in a 5×5 pattern. Accordingly, the pixel signal SIG_PX_4 may include first through fiftieth green pixel values G1S through G50S, first through twenty-fifth red pixel values R1S through R25S, and first through twenty-fifth blue pixel values B1S through B25S. Here, the twenty-sixth through fiftieth green pixel values G26S through G50S may correspond to a bad pixel group signal BPXG.

The image signal processor 900 may replace the bad pixel group signal BPXG with a corrected pixel group signal CPXG. Here, the corrected pixel group signal CPXG may be generated using pixel values other than the bad pixel group signal BPXG. The corrected pixel group signal CPXG may include first through thirteenth corrected green pixel values CG1S through CG13S, first through sixth corrected blue pixel values CB1S through CB6S, and first through sixth corrected red pixel values CR1S through CR6S. That is, the corrected pixel group signal CPXG may include all pixel values for a red color, a green color, and a blue color.

In summary, the image signal processor 900 may generate the corrected pixel group signal CPXG corresponding to an RGB Bayer pattern by performing bad pixel correction on the pixel signal SIG_PX_4 corresponding to the 5×5 pattern.

Figure 25:
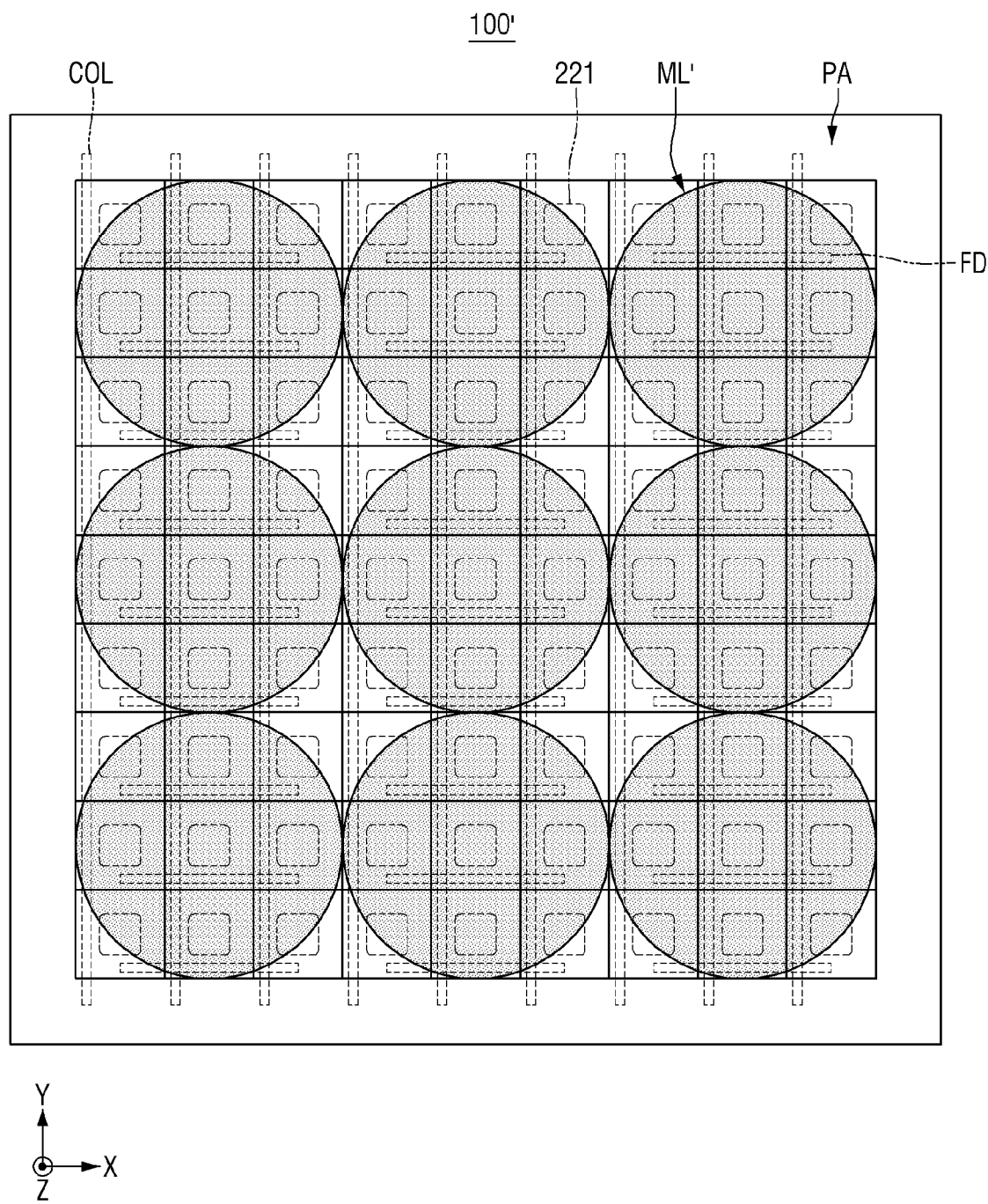
FIG. 25 is a top view of an image sensor 100' according to an embodiment.

FIG. 25 is a top view of an image sensor 100' according to embodiments.

Referring to FIG. 25, the image sensor 100' may include microlenses ML'. Here, each of the microlenses ML' may overlap a plurality of pixels. That is, while a microlens ML of the image sensor 100 described with reference to FIGS. 1 through 24 overlaps only one pixel, a microlens ML' of the image sensor 100' may overlap the whole of a first nona green pixel group NGG1, for example. All of the light passing through the microlens ML' may be incident on the first nona green pixel group NGG1. However, embodiments are not limited thereto.

Figure 26:
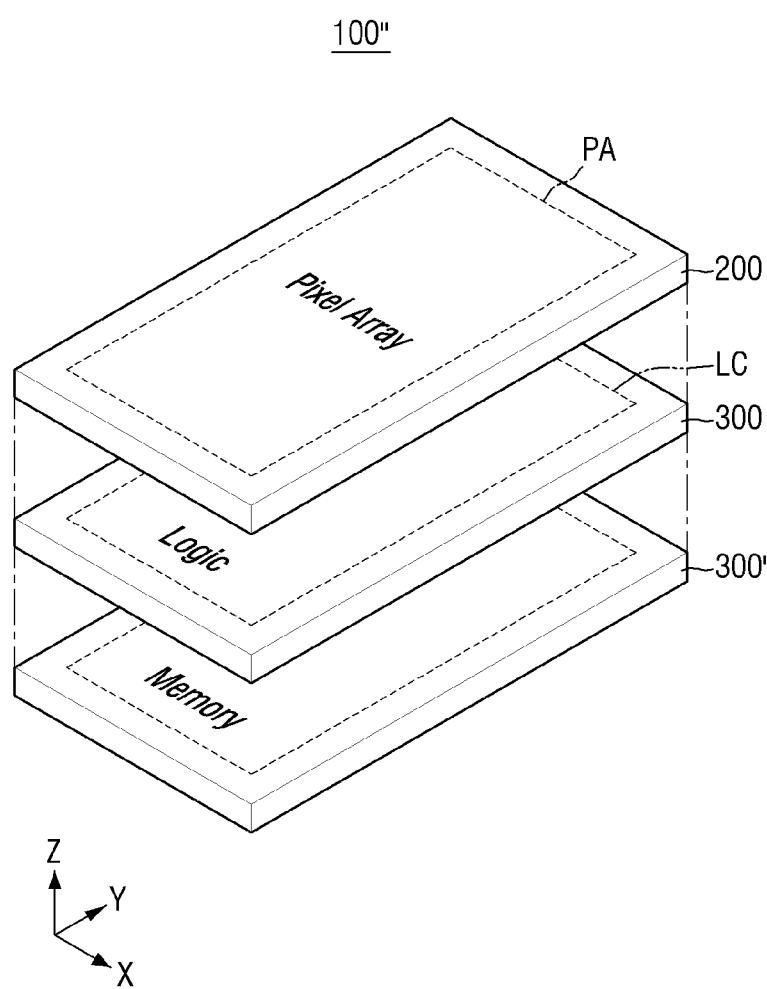
FIG. 26 illustrates the conceptual layout of an image sensor 100" according to an embodiment.

FIG. 26 illustrates the conceptual layout of an image sensor 100" according to embodiments.

Referring to FIG. 26, the image sensor 100" may include an upper chip 200, a lower chip 300, and a memory chip 300'. Here, the upper chip 200, the lower chip 300, and the memory chip 300' may be sequentially stacked along a third direction Z. The memory chip 300' may be disposed under the lower chip 300. The memory chip 300' may include a memory device. For example, the memory chip 300' may include a volatile memory device such as a DRAM or an SRAM. The memory chip 300' may receive a signal from the upper chip 200 and the lower chip 300 and process the signal through the memory device. That is, the image sensor 100" including the memory chip 300' may correspond to a 3-stack image sensor.

An electronic device 2000 according to embodiments will now be described with reference to FIGS. 27 and 28.

Figure 27:
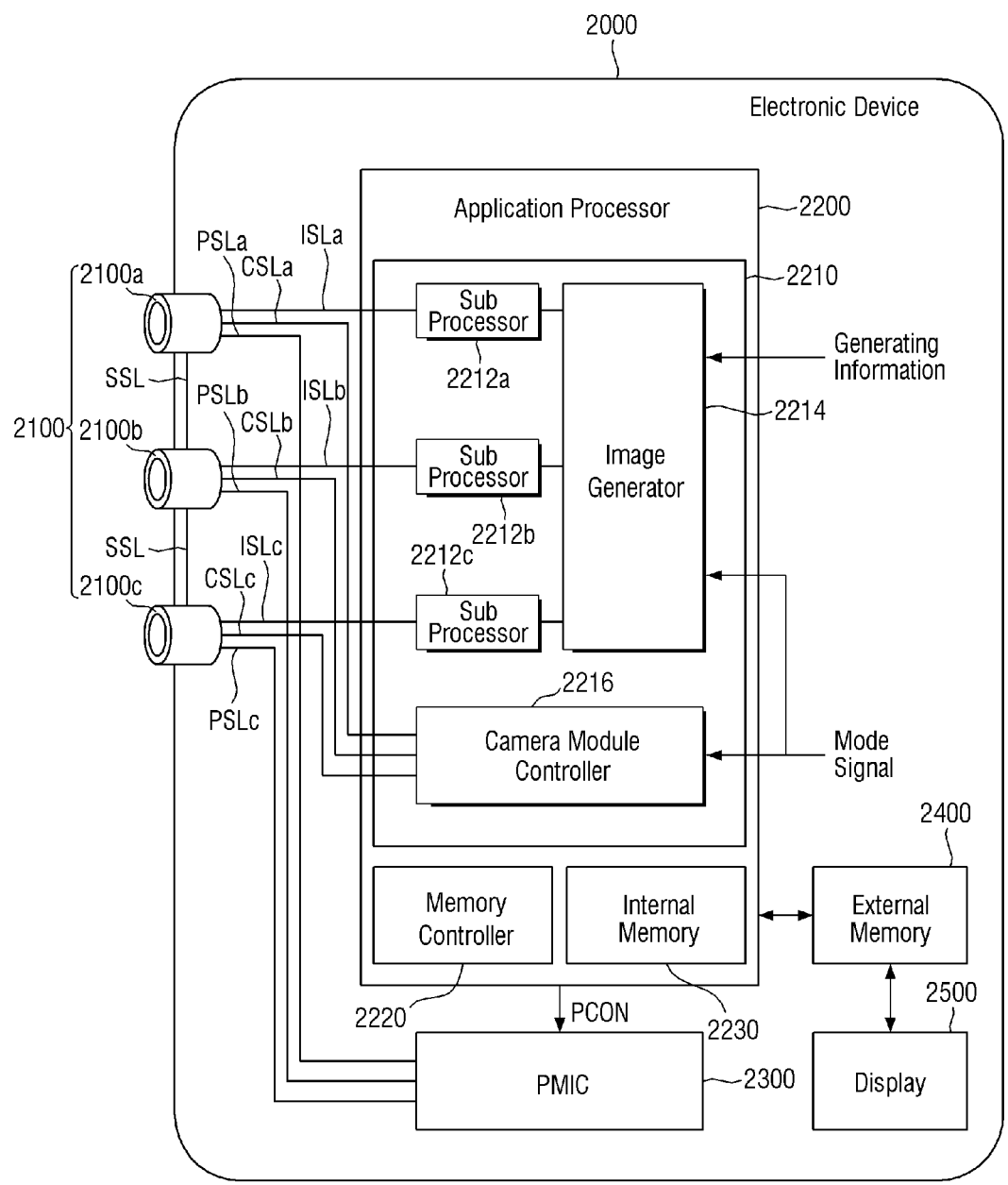
FIG. 27 is a block diagram of an electronic device 2000 including multiple camera modules 2100a through 2100c according to an embodiment.

FIG. 27 is a block diagram of an electronic device 2000 including multiple camera modules 2100a through 2100c according to embodiments. FIG. 28 is a detailed block diagram of a camera module 2100b of FIG. 27. For ease of description, a description of the same elements and features as those described with reference to FIGS. 1 through 26 will be given briefly or omitted.

Referring to FIG. 27, the electronic device 2000 may include a camera module group 2100, an application processor 2200, a power management integrated circuit (PMIC) 2300, an external memory 2400, and a display 2500.

The camera module group 2100 may include a plurality of camera modules 2100a through 2100c. Although an embodiment in which three camera modules 2100a through 2100c are disposed is illustrated in the drawing, embodiments are not limited thereto. In some embodiments, the camera module group 2100 may be modified to include only two camera modules. In addition, in some embodiments, the camera module group 2100 may be modified to include n (n is a natural number of 4 or more) camera modules.

Here, any one or more of the three camera modules 2100a through 2100c may be a camera module including the image sensor 100 described using FIGS. 1 through 26.

The detailed configuration of the camera module 2100b will now be described in more detail with reference to FIG. 28, but the following description may apply equally to other camera modules 2100a and 2100c according to embodiments.

Figure 28:
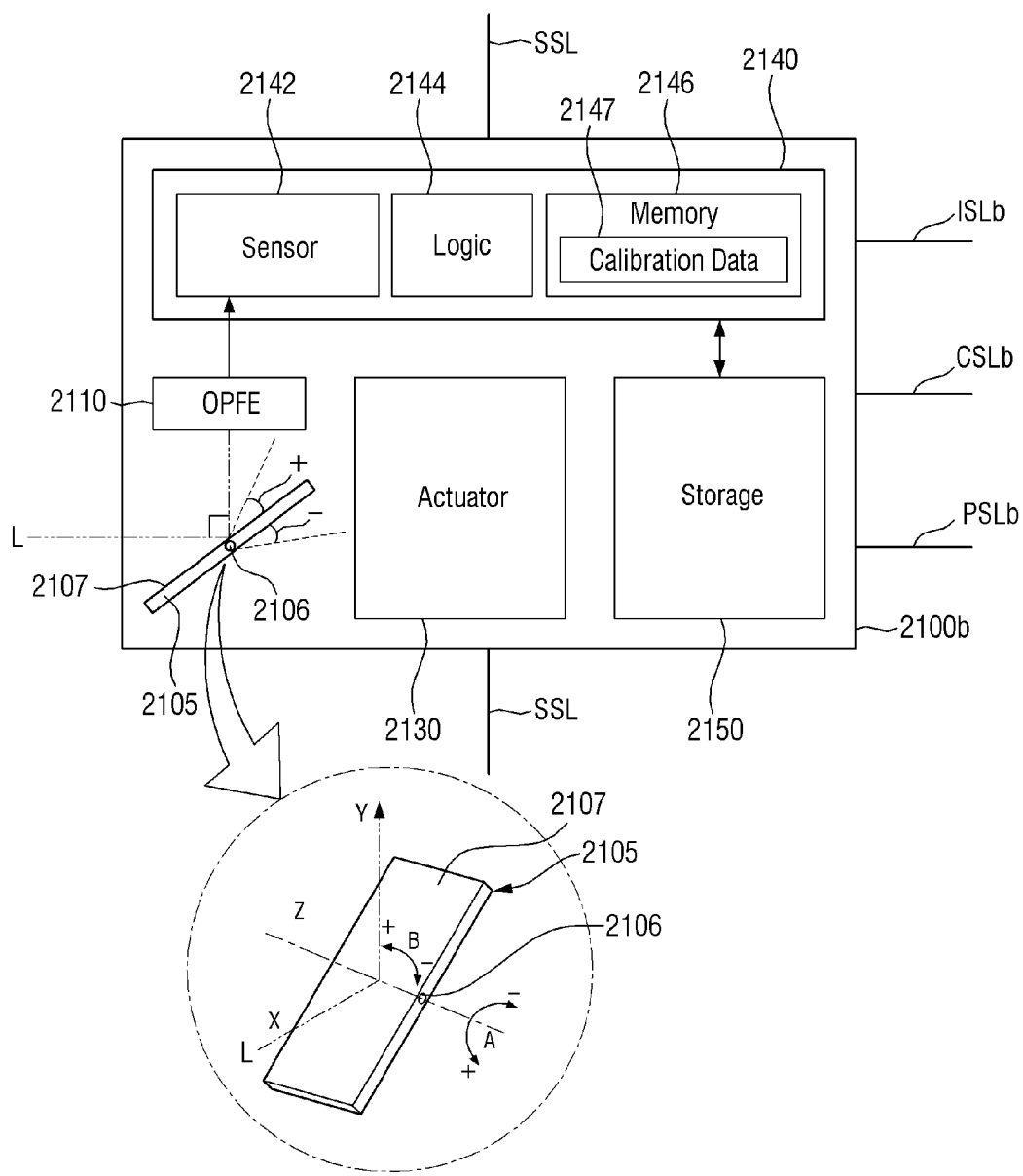
FIG. 28 is a detailed block diagram of a camera module 2100b of FIG. 27.

Referring to FIG. 28, the camera module 2100b may include a prism 2105, an optical path folding element (OPFE) 2110, an actuator 2130, an image sensing device 2140, and a storage unit 2150.

The prism 2105 may include a reflective surface 2107 of a light reflecting material to change the path of light L incident from the outside.

In some embodiments, the prism 2105 may change the path of the light L incident in a first direction X to a second direction Y perpendicular to the first direction X. In addition, the prism 2105 may change the path of the light L incident in the first direction X to the second direction Y perpendicular to the first direction X by rotating the reflective surface 2107 of the light reflecting material around a central axis 2106 in an A direction or rotating the central axis 2106 in a B direction. At this time, the OPFE 2110 may also move in a third direction Z perpendicular to the first direction X and the second direction Y.

In some embodiments, as illustrated, a maximum rotation angle of the prism 2105 in the A direction may be, but is not limited to, 15 degrees or less in a positive (+) A direction and greater than 15 degrees in a negative (−) A direction.

In some embodiments, the prism 2105 may move at an angle of about 20 degrees, 10 to 20 degrees, or 15 to 20 degrees in a positive (+) or negative (−) B direction. Here, the prism 2105 may move at the same angle in the positive (+) or negative (−) B direction or may move at almost the same angle with a difference of about 1 degree.

In some embodiments, the prism 2105 may move the reflective surface 2107 of the light reflecting material in the third direction (e.g., the Z direction) parallel to a direction in which the central axis 2106 extends.

The OPFE 2110 may include a group of m (where m is a natural number) optical lenses. The m lenses may move in the second direction Y to change an optical zoom ratio of the camera module 2100b. For example, when a basic optical zoom ratio of the camera module 2100b is Z, if the m optical lenses included in the OPFE 2110 are moved, the optical zoom ratio of the camera module 2100b may be changed to an optical zoom ratio of 3Z or 5Z or more.

The actuator 2130 may move the OPFE 2110 or the optical lenses (hereinafter, referred to as an optical lens) to a specific position. For example, the actuator 2130 may adjust the position of the optical lens so that an image sensor 2142 is located in a focal length of the optical lens for accurate sensing.

The image sensing device 2140 may include the image sensor 2142, a control logic 2144, and a memory 2146. The image sensor 2142 may sense an image of a sensing target by using the light L provided through the optical lens. In some embodiments, the image sensor 2142 may include the image sensor 100 described above.

The control logic 2144 may control the overall operation of the camera module 2100b. For example, the control logic 2144 may control the operation of the camera module 2100b according to a control signal provided through a control signal line CSLb.

The memory 2146 may store information necessary for the operation of the camera module 2100b, such as calibration data 2147. The calibration data 2147 may include information necessary for the camera module 2100b to generate image data using the light L provided from the outside. The calibration data 2147 may include, for example, information about the degree of rotation described above, information about a focal length, and information about an optical axis. When the camera module 2100b is implemented as a multi-state camera whose focal length changes according to the position of the optical lens, the calibration data 2147 may include a focal length value for each position (or state) of the optical lens and information related to auto focusing.

The storage unit 2150 may store image data sensed through the image sensor 2142. The storage unit 2150 may be disposed outside the image sensing device 2140 and may be implemented in a stacked form with a sensor chip constituting the image sensing device 2140. In some embodiments, the storage unit 2150 may be implemented as, but not limited to, an electrically erasable programmable read-only memory (EEPROM). The storage unit 2150 may be implemented by a lower chip 300 as shown, e.g., in FIG. 26.

Referring to FIGS. 27 and 28 together, in some embodiments, each of the camera modules 2100a through 2100c may include the actuator 2130. Accordingly, the camera modules 2100a through 2100c may include the same or different calibration data 2147 according to the operation of the actuators 2130 included therein.

In some embodiments, one (e.g., 2100b) of the camera modules 2100a through 2100c may be a folded lens camera module including the prism 2105 and the OPFE 2110 described above, and the other camera modules (e.g., 2100a and 2100c) may be vertical camera modules not including the prism 2105 and the OPFE 2110. However, embodiments are not limited thereto.

In some embodiments, one (e.g., 2100c) of the camera modules 2100a through 2100c may be a vertical depth camera which extracts depth information using, for example, infrared rays (IR). In this case, the application processor 2200 may generate a three-dimensional (3D) depth image by merging image data received from the depth camera and image data received from another camera module (e.g., 2100a or 2100b).

In some embodiments, at least two (e.g., 2100a and 2100c) of the camera modules 2100a through 2100c may have different fields of view (viewing angles). In this case, optical lenses of at least two (e.g., 2100a and 2100c) of the camera modules 2100a through 2100c may be different from each other, but embodiments are not limited thereto.

In addition, in some embodiments, the camera modules 2100a through 2100c may have different viewing angles. In this case, optical lenses included in the camera modules 2100a through 2100c may also be different from each other, but embodiments are not limited thereto.

In some embodiments, the camera modules 2100a through 2100c may be physically separated from each other. That is, a sensing region of a single image sensor 2142 may not be divided and used by the camera modules 2100a through 2100c, but instead an independent image sensor 2142 may be disposed in each of the camera modules 2100a through 2100c.

Referring again to FIG. 27, the application processor 2200 may include an image processing device 2210, a memory controller 2220, and an internal memory 2230. The application processor 2200 may be separated from the camera modules 2100a through 2100c. For example, the application processor 2200 and the camera modules 2100a through 2100c may be implemented as separate semiconductor chips.

The image processing device 2210 may include a plurality of sub image processors 2212a through 2212c, an image generator 2214, and a camera module controller 2216.

The image processing device 2210 may include a number of sub image processors 2212a through 2212c corresponding to the number of camera modules 2100a through 2100c.

Image data generated by the camera modules 2100a through 2100c may be provided to the respective sub image processors 2212a through 2212c through corresponding image signal lines ISLa through ISLc separated from each other. For example, image data generated by the camera module 2100a may be provided to the sub image processor 2212a through the image signal line ISLa, image data generated by the camera module 2100b may be provided to the sub image processor 2212b through the image signal line ISLb, and image data generated by the camera module 2100c may be provided to the sub image processor 2212c through the image signal line ISLc. This image data transmission may be performed, for example, using a camera serial interface (CSI) based on a mobile industry processor interface (MIPI), but embodiments are not limited thereto.

In some embodiments, one sub image processor may be disposed to correspond to a plurality of camera modules. For example, the sub image processor 2212a and the sub image processor 2212c may not be separated from each other as illustrated in the drawing but may be integrated into a single sub image processor, and image data provided by the camera module 2100a and the camera module 2100c may be selected through a select element (e.g., a multiplexer) and then provided to the single sub image processor.

The image data provided to each of the sub image processors 2212a through 2212c may be provided to the image generator 2214. The image generator 2214 may generate an output image using the image data received from each of the sub image processors 2212a through 2212c according to image generating information or a mode signal.

Specifically, the image generator 2214 may generate an output image by merging at least some of the image data generated by the camera modules 2100a through 2100c having different viewing angles according to the image generating information or the mode signal. In addition, the image generator 2214 may generate an output image by selecting any one of the image data generated by the camera modules 2100a through 2100c having different viewing angles according to the image generating information or the mode signal.

In some embodiments, the image generating information may include a zoom signal or a zoom factor. In addition, in some embodiments, the mode signal may be, for example, a signal based on a mode selected by a user.

When the image generating information is the zoom signal (zoom factor) and the camera modules 2100a through 2100c have different fields of view (viewing angles), the image generator 2214 may operate differently according to the type of the zoom signal. For example, if the zoom signal is a first signal, the image generator 2214 may merge image data output from the camera module 2100a and image data output from the camera module 2100c and then generate an output image using the merged image signal and image data output from the camera module 2100b not used in the merging. If the zoom signal is a second signal different from the first signal, the image generator 2214 may not perform such image data merging and may instead generate an output image by selecting any one of the image data output from the camera modules 2100a through 2100c. However, embodiments are not limited thereto, and the method of processing image data can be modified as needed.

In some embodiments, the image generator 2214 may receive a plurality of image data having different exposure times from at least one of the sub image processors 2212a through 2212c and may generate merged image data with an increased dynamic range by performing high dynamic range (HDR) processing on the image data.

The camera module controller 2216 may provide a control signal to each of the camera modules 2100a through 2100c. The control signal generated by the camera module controller 2216 may be provided to the camera modules 2100a through 2100c through corresponding control signal lines CSLa through CSLc separated from each other.

Any one (e.g., 2100a) of the camera modules 2100a through 2100c may be designated as a master camera according to the image generating information including the zoom signal or the mode signal, and the other camera modules (e.g., 2100b and 2100c) may be designated as slave cameras. This information may be included in the control signal and provided to the camera modules 2100a through 2100c through the corresponding control signal lines CSLa through CSLc separated from each other.

Camera modules operating as a master and a slave may be changed according to the zoom factor or the operation mode signal. For example, when the viewing angle of the camera module 2100a is wider than that of the camera module 2100c and the zoom factor indicates a low zoom ratio, the camera module 2100c may operate as a master, and the camera module 2100a may operate as a slave. Conversely, when the zoom factor indicates a high zoom ratio, the camera module 2100a may operate as a master, and the camera module 2100c may operate as a slave.

In some embodiments, the control signal provided from the camera module controller 2216 to each of the camera modules 2100a through 2100c may include a sync enable signal. For example, when the camera module 2100b is a master camera and the camera modules 2100a and 2100c are slave cameras, the camera module controller 2216 may transmit the sync enable signal to the camera module 2100b. The camera module 2100b receiving the sync enable signal may generate a sync signal based on the sync enable signal and provide the generated sync signal to the camera modules 2100a and 2100c through a sync signal line SSL. The camera module 2100b and the camera modules 2100a and 2100c may then transmit image data to the application processor 2200 in synchronization with the sync signal.

In some embodiments, the control signal provided from the camera module controller 2216 to the camera modules 2100a through 2100c may include mode information according to the mode signal. Based on the mode information, the camera modules 2100a through 2100c may operate in a first operation mode and a second operation mode in relation to the sensing speed.

In the first operation mode, the camera modules 2100a through 2100c may generate an image signal at a first speed (e.g., generate an image signal of a first frame rate), encode the image signal at a second speed higher than the first speed (e.g., encode the image signal into an image signal of a second frame rate higher than the first frame rate), and transmit the encoded image signal to the application processor 2200. Here, the second speed may be 30 times or less the first speed.

The application processor 2200 may store the received image signal, in other words, the encoded image signal in the memory 2230 included in the application processor 2200 or the storage 2400 outside the application processor 2200. Later, the application processor 2200 may read the encoded image signal from the memory 2230 or the storage 2400, decode the read image signal, and display image data generated based on the decoded image signal. For example, a corresponding sub processor among the sub processors 2212a through 2212c of the image processing device 2210 may decode the encoded image signal and may also perform image processing on the decoded image signal. For example, image data generated based on the decoded image signal may be displayed on the display 2500.

In the second operation mode, the camera modules 2100a through 2100c may generate an image signal at a third speed lower than the first speed (e.g., generate an image signal of a third frame rate lower than the first frame rate) and transmit the image signal to the application processor 2200. The image signal provided to the application processor 2200 may be an unencoded signal. The application processor 2200 may perform image processing on the received image signal or may store the image signal in the memory 2230 or the storage 2400.

The PMIC 2300 may supply power, for example, a power supply voltage to each of the camera modules 2100a through 2100c. For example, the PMIC 2300 may supply first power to the camera module 2100a through a power signal line PSLa, supply second power to the camera module 2100b through a power signal line PSLb, and supply third power to the camera module 2100c through a power signal line PSLc under the control of the application processor 2200.

The PMIC 2300 may generate power corresponding to each of the camera modules 2100a through 2100c and also adjust the level of the power in response to a power control signal PCON from the application processor 2200. The power control signal PCON may include a power adjustment signal for each operation mode of the camera modules 2100a through 2100c. For example, the operation modes may include a low power mode. Here, the power control signal PCON may include information about a camera module operating in the lower power mode and a set power level. The level of power provided to each of the camera modules 2100a through 2100c may be the same or different. In addition, the level of the power may be dynamically changed.

At least one of the components, elements, modules or units (collectively "components" in this paragraph) represented by a block in the drawings including FIGS. 1, 9, 21, 27 and 28 may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosure has been particularly shown and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:
1. An image sensor comprising:
   a pixel array comprising:
      a first pixel group comprising a plurality of first color pixels having a first color and outputting a first pixel signal for the first color;
      a second pixel group comprising a plurality of second color pixels having a second color different from the first color and outputting a second pixel signal for the second color; and a third pixel group comprising a plurality of third color pixels having a third color different from the first and second colors and outputting a third pixel signal for the third color; and an image signal processor configured to receive the first pixel signal, the second pixel signal, and the third pixel signal from the pixel array, wherein the image signal processor, based on the first pixel signal being determined as a bad pixel signal, is configured to generate a corrected pixel signal for the first through third colors by performing bad pixel correction on the first pixel signal based on the second pixel signal and the third pixel signal, and generate a remosaiced pixel signal for the first through third colors by remosaicing the third pixel signal based on the second pixel signal and remosaicing the second pixel signal based on the third pixel signal, wherein the plurality of first color pixels, the plurality of second color pixels and the plurality of third color pixels are arranged in a first pattern in the pixel array, and wherein the corrected pixel signal and the remosaiced pixel signal represent information in which the first through third color pixels are rearranged in a second pattern having a higher frequency than a frequency of the first pattern.

2. The image sensor of claim 1, wherein the first pixel group comprises a first floating diffusion shared by the plurality of first color pixels, the second pixel group comprises a second floating diffusion shared by the plurality of second color pixels, and the third pixel group comprises a third floating diffusion shared by the plurality of third color pixels, wherein the first floating diffusion is defective based on the first pixel signal being determined as the bad pixel signal.

3. The image sensor of claim 1, wherein the plurality of second color pixels and the plurality of third color pixels, which respectively output the second pixel signal and the third pixel signal when the bad pixel correction is performed on the first pixel signal, are disposed adjacent to the first pixel group.

4. The image sensor of claim 3, wherein the first pixel group comprises a first subpixel located in an edge part of the first pixel group and a second subpixel located in a central part of the first pixel group, and wherein the image signal processor generates a first corrected subpixel signal by performing the bad pixel correction on a first subpixel signal output from the first subpixel based on the second pixel signal and the third pixel signal.

5. The image sensor of claim 4, wherein the image signal processor generates a second corrected subpixel signal by performing the bad pixel correction on a second subpixel signal output from the second subpixel based on the first corrected subpixel signal.

6. The image sensor of claim 1, wherein the image signal processor determines whether the first pixel signal is the bad pixel signal.

7. The image sensor of claim 1, wherein the first pixel group is disposed adjacent to the second pixel group and the third pixel group.

8. The image sensor of claim 1, wherein the first pattern comprises a tetra pattern, and the second pattern comprises a Bayer pattern.

9. The image sensor of claim 1, wherein the image signal processor outputs an image signal comprising the corrected pixel signal and the remosaiced pixel signal and demosaics the image signal.

10. The image sensor of claim 1, wherein based on the first pixel signal being determined as the bad pixel signal, the image signal processor is configured to generate the corrected pixel signal without a process of correcting the first pixel signal to a signal for the plurality of first color pixels arranged in the first pattern.

11. The image sensor of claim 1, wherein the image signal processor is configured to generate the remosaiced pixel signal by further remosaicing the first pixel signal based on the second and third pixel signals, and correct the remosaiced pixel signal based on the corrected pixel signal.

12. The image sensor of claim 1, wherein the first pattern comprises a nona pattern, and the second pattern comprises a Bayer pattern.

13. The image sensor of claim 1, wherein the first pixel group comprises at least four first color pixels, the second pixel group comprises at least four second color pixels, and the third pixel group comprises at least four third color pixels.

14. An image sensor comprising:
a pixel array comprising:
a first pixel group comprising a plurality of first color pixels having a first color and outputting a first pixel signal for the first color;
a second pixel group comprising a plurality of second color pixels having a second color different from the first color and outputting a second pixel signal for the second color; and
a third pixel group comprising a plurality of third color pixels having a third color different from the first and second colors and outputting a third pixel signal for the third color; and
a processor comprising:
a bad pixel corrector which, based on the first pixel signal being a bad pixel signal, is configured to generate a first corrected pixel signal for the first through third colors by performing bad pixel correction on the first pixel signal based on the second pixel signal and the third pixel signal; and
a remosaic module which is configured to generate a first remosaiced pixel signal for the first through third colors by remosaicing the third pixel signal based on the second pixel signal and remosaicing the second pixel signal based on the third pixel signal.

15. The image sensor of claim 14, wherein the processor is configured to demosaic the first corrected pixel signal and the first remosaiced pixel signal.

16. The image sensor of claim 14, wherein the first pixel signal comprises a plurality of first pixel values, the second pixel signal comprises a plurality of second pixel values, and the third pixel signal comprises a plurality of third pixel values.

17. The image sensor of claim 16, further comprising a binning unit which is configured to generate a first binning pixel signal by performing binning on the plurality of first pixel values, generate a second binning pixel signal by performing binning on the plurality of second pixel values, and generate a third binning pixel signal by performing binning on the plurality of third pixel values.

18. The image sensor of claim 17, wherein the bad pixel corrector is configured to receive the first through third binning pixel signals from the binning unit, determine the first binning pixel signal as the bad pixel signal based on the first pixel signal being determined as the bad pixel signal, and generate a binning corrected pixel signal for the first through third colors by performing the bad pixel correction on the first binning pixel signal based on the second and third binning pixel signals.

19. The image sensor of claim 14, wherein the bad pixel corrector is configured to generate a second corrected pixel signal for the first color by performing the bad pixel correction on the first pixel signal, and
wherein the remosaic module is configured to generate a second remosaiced pixel signal for the first through third colors by performing remosaicing based on the second corrected pixel signal, the second pixel signal and the third pixel signal, and generate an image signal based on the first corrected pixel signal, the second corrected pixel signal, the first remosaiced pixel signal and the second remosaiced pixel signal.

20. An image signal processing method comprising:
receiving a first pixel signal comprising a plurality of first pixel values for a first color, a second pixel signal comprising a plurality of second pixel values for a second color different from the first color, a third pixel signal comprising a plurality of third pixel values for a third color different from the first and second colors, and a fourth pixel signal comprising a plurality of fourth pixel values for the first color;
determining whether the plurality of first pixel values are bad pixel values;
based on the plurality of first pixel values being determined to be bad pixel values, detecting an angle from the first through fourth pixel signals;
calculating a first conversion formula between the plurality of second pixel values and the plurality of fourth pixel values based on the plurality of second pixel values, the plurality of fourth pixel values and the angle;
calculating a second conversion formula between the plurality of third pixel values and the plurality of fourth pixel values based on the plurality of third pixel values, the plurality of fourth pixel values and the angle; and
generating corrected pixel values for the first through third colors by correcting the plurality of first pixel values based on at least one of the plurality of second pixel values, the plurality of third pixel values, and the plurality of fourth pixel values by using the first and second conversion formulas.

* * * * *